(12) United States Patent
Koga

(10) Patent No.: US 6,268,710 B1
(45) Date of Patent: Jul. 31, 2001

(54) BATTERY MONITOR APPARATUS

(75) Inventor: Kazunobu Koga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/539,626

(22) Filed: Mar. 31, 2000

(30) Foreign Application Priority Data

Jul. 9, 1999 (JP) .................................. 11-196499
Jul. 30, 1999 (JP) .................................. 11-218036

(51) Int. Cl.$^7$ ........................... H02J 7/14; G01N 27/416
(52) U.S. Cl. ..................... 320/116; 320/162; 320/166; 324/433
(58) Field of Search ............................ 320/116, 117, 320/120, 121, 162, 166; 324/433, 434

(56) References Cited

U.S. PATENT DOCUMENTS 4,823,086 * 4/1989 Whitmire et al. .................... 324/434
6,121,751 * 9/2000 Merritt ................................. 320/116

* cited by examiner

Primary Examiner—Peter S. Wong
Assistant Examiner—Gregory J. Toatley, Jr.
(74) Attorney, Agent, or Firm—Armstrong, Westerman, Hattori, McLeland & Naughton, LLP

(57) ABSTRACT

A battery monitor apparatus for monitoring the voltage of each cell of a battery pack including a plurality of cells is disclosed, in which each cell of the battery pack having the plurality of cells is connected to a capacitor by a switch, so that the cell voltage is retrieved and measured, and the current is detected, thereby making it possible to control the charge/discharge of each cell. This apparatus includes a capacitor, a switch group for connecting the ends of an arbitrary one of the cells constituting the battery pack or the ends of an arbitrary plurality of the cells to the capacitor thereby to retrieve the voltage of one cell or a plurality of the cells, and a detector for detecting the voltage of the capacitor.

19 Claims, 23 Drawing Sheets

Fig. 3B

| ITEM | SPECIFIC OPERATION | SWITCH TO BE CLOSED | SWITCH TO BE OPENED |
|---|---|---|---|
| 1 | CELL 1 TERMINAL VOLTAGE DETECTION (WHEN CAPACITOR IS CHARGED) | SW1, SW2B | OTHER SWITCHES |
| 2 | CELL 2 TERMINAL VOLTAGE DETECTION (WHEN CAPACITOR IS CHARGED) | SW2A, SW3B | OTHER SWITCHES |
| 3 | CELL 3 TERMINAL VOLTAGE DETECTION (WHEN CAPACITOR IS CHARGED) | SW3A, SW4B | OTHER SWITCHES |
| 4 | CELL 4 TERMINAL VOLTAGE DETECTION (WHEN CAPACITOR IS CHARGED) | SW4A, SW5 | OTHER SWITCHES |
| 5 | WHOLE VOLTAGE DETECTION OF BATTERY PACK (WHEN CAPACITOR IS CHARGED) | SW1, SW5 | OTHER SWITCHES |
| 6 | MEASUREMENT OF SINGLE CELL (MEASUREMENT WITH ADC) | SW6, SW8, SW9 | OTHER SWITCHES |
| 7 | MEASUREMENT OF WHOLE BATTERY PACK (MEASUREMENT WITH ADC) | SW6, SW8, SW10 | OTHER SWITCHES |
| 8 | ZERO VOLTAGE CALIBRATION (AT TIME OF ADJUSTMENT) | SW7, SW9 | OTHER SWITCHES |

Fig.4B

| ITEM | SPECIFIC OPERATION | SWITCH TO BE CLOSED | SWITCH TO BE OPENED |
|---|---|---|---|
| 1 | CELL 1 TERMINAL VOLTAGE DETECTION (WHEN CAPACITOR IS CHARGED) | SW1, SW2B | OTHER SWITCHES |
| 2 | CELL 2 TERMINAL VOLTAGE DETECTION (WHEN CAPACITOR IS CHARGED) | SW2A, SW3B | OTHER SWITCHES |
| 3 | CELL 3 TERMINAL VOLTAGE DETECTION (WHEN CAPACITOR IS CHARGED) | SW3A, SW4B | OTHER SWITCHES |
| 4 | CELL 4 TERMINAL VOLTAGE DETECTION (WHEN CAPACITOR IS CHARGED) | SW4A, SW5 | OTHER SWITCHES |
| 5 | WHOLE VOLTAGE DETECTION OF BATTERY PACK (WHEN CAPACITOR IS CHARGED) | SW10, SW11 | OTHER SWITCHES |
| 6 | MEASUREMENT OF EACH VOLTAGE (WHEN MEASURED WITH ADC) | SW6, SW8 | OTHER SWITCHES |
| 7 | ZERO VOLTAGE CALIBRATION (AT TIME OF ADJUSTMENT) | SW7 | OTHER SWITCHES |

Fig. 20

| CELL | STATE | | | | CELL VOLTAGE [V] | CAPACITY LEVEL [%] |
|---|---|---|---|---|---|---|
| | DISCHARGING | CHARGING | DISCHARGE ALARM | CHARGE ALARM | | |
| 1 | ● | ○ | ○ | ○ | 3.6 | 61.1 |
| 2 | ○ | ○ | ● | ○ | 2.5 | 0.0 |
| 3 | ○ | ○ | ○ | ● | 4.3 | 100.0 |
| 4 | ● | ○ | ○ | ○ | 3.7 | 66.7 |
| WHOLE PACK | | | | | 14.1 | 56.9 |

BATTERY MONITOR APPARATUS

BACKGROUND OF THE INVENTION

1. Field of the Invention

The present invention relates to a battery monitor apparatus for monitoring the voltage of each cell of a battery pack configured with a plurality of cells.

2. Description of the Related Art

In the prior art, a secondary battery (a chargeable/dischargeable battery such as a lithium ion battery) is used as a battery pack (including a plurality of cells (battery cells) connected in series and parallel) for supplying power to various portable equipment. When the charge/discharge of the battery is repeated, especially of the lithium ion battery, it is necessary to monitor the voltage of the whole battery pack and the over-charge/over-discharge of each cell and to take preventive measures such as stopping the charge or discharge as required.

For this purpose, in the circuit shown in FIG. 13A, when an over-charge comparator circuit detects that the voltage of the whole battery pack has increased beyond a specified voltage corresponding to the number of cells constituting the battery pack at the time of charge, the charge is stopped. At the time of discharge, on the other hand, the discharge is stopped when an over-discharge comparator circuit detects that the voltage of the whole battery pack has decreased to below a specified voltage corresponding to the number of cells constituting the battery pack.

Also, in the circuit shown in FIG. 13B, an operational amplifier (OP amplifier) is attached to each cell making up the battery pack, so that upon detection of the potential of the positive electrode of each cell, the voltage of each stand-alone cell is calculated, by subtracting the potential of each cell sequentially in the OP amplifier, and notified to a microprocessing unit (MPU) not shown. In the event that the voltage of each stand-alone cell deviates from a specified voltage range during charge or discharge, the discharge or charge, as the case may be, is stopped, a cell voltage failure is detected, an alarm is issued or other appropriate measure is executed for controlling the prevailing state.

In spite of this requirement, the conventional circuit shown in FIG. 13A, though simple in configuration, harbors the problem that it is impossible to detect for each stand-alone cell whether the charge/discharge voltage for each cell has deviated from a specified range or not.

Also, in the conventional circuit shown in FIG. 13B, the voltage of each cell is calculated by an OP amplifier connected to each cell and other OP amplifiers for subtracting the outputs of the OP amplifiers. With the increase in the number of cells, the OP amplifiers also increase in number. Further, it is difficult to regulate the individual offsets accurately in view of the characteristics of OP amplifiers made up of analog elements. This leads to the problem that an increased number of cells increases the voltage error of each cell due to the offset error. Another problem is that the offset regulation circuit, if attached to each OP amplifier, complicates the circuit configuration greatly and requires a large space.

Still another problem is the voltage imbalance at the time of charge or discharge between a plurality of cells in series of the battery pack. Especially during charging, an over-charged cell may exist. Nevertheless, the state of each cell (over-charged or over-discharged or normal) is not detected nor displayed individually, thereby giving rise to the problem of an unknown state.

SUMMARY OF THE INVENTION

In order to solve these problems, an object of the present invention is to provide a battery monitor apparatus in which each of a plurality of cells of the battery pack is connected to a capacitor through a switch so that the cell voltage is retrieved and measured thereby to detect the current.

Another object of the invention is to control the charge and discharge for each cell.

Still another object of the invention is to detect and display the over-charged or over-discharged alarm state for each cell or for plural cells.

In order to achieve the objects described above, according to one aspect of the present invention, there is provided a battery monitor apparatus, for monitoring at least the voltage of each cell of the battery pack made up of a plurality of cells, comprising a capacitor, a group of switches for connecting the two ends of an arbitrary one of a plurality of cells making up the battery pack or the two ends of plural cells smaller in number than the total number of the cells to the capacitor thereby to retrieve the voltage of the single cell or plural cells, as the case may be, and a detector for detecting the voltage across the capacitor.

According to another aspect of the present invention, there is provided a battery monitor apparatus for monitoring at least the voltage of each one of a plurality of cells of a battery pack, comprising a capacitor, a group of switches for connecting the two ends of an arbitrary one of a plurality of cells making up the battery pack or the two ends of plural cells smaller in number than the total number of the cells to the capacitor thereby to retrieve the voltage of the single cell or the plural cells, as the case may be, a comparator circuit for detecting a normal, an over-charged or an over-discharged state by comparing the voltage of the capacitor with a predetermined reference voltage, and a circuit for storing the normal, an over-charged state or an over-discharged state.

BRIEF DESCRIPTION OF THE DRAWINGS

Further features and advantages of the present invention will be apparent from the following description with reference to the accompanying drawings, in which;

FIG. 3B is a diagram for explaining the operation of the switch included in the circuit;

FIG. 4B is a diagram for explaining the operation of the switch included in the circuit;

FIG. 20 is a diagram for explaining a voltage monitor screen according to the invention.

DESCRIPTION OF THE PREFERRED EMBODIMENTS

Figure 1:
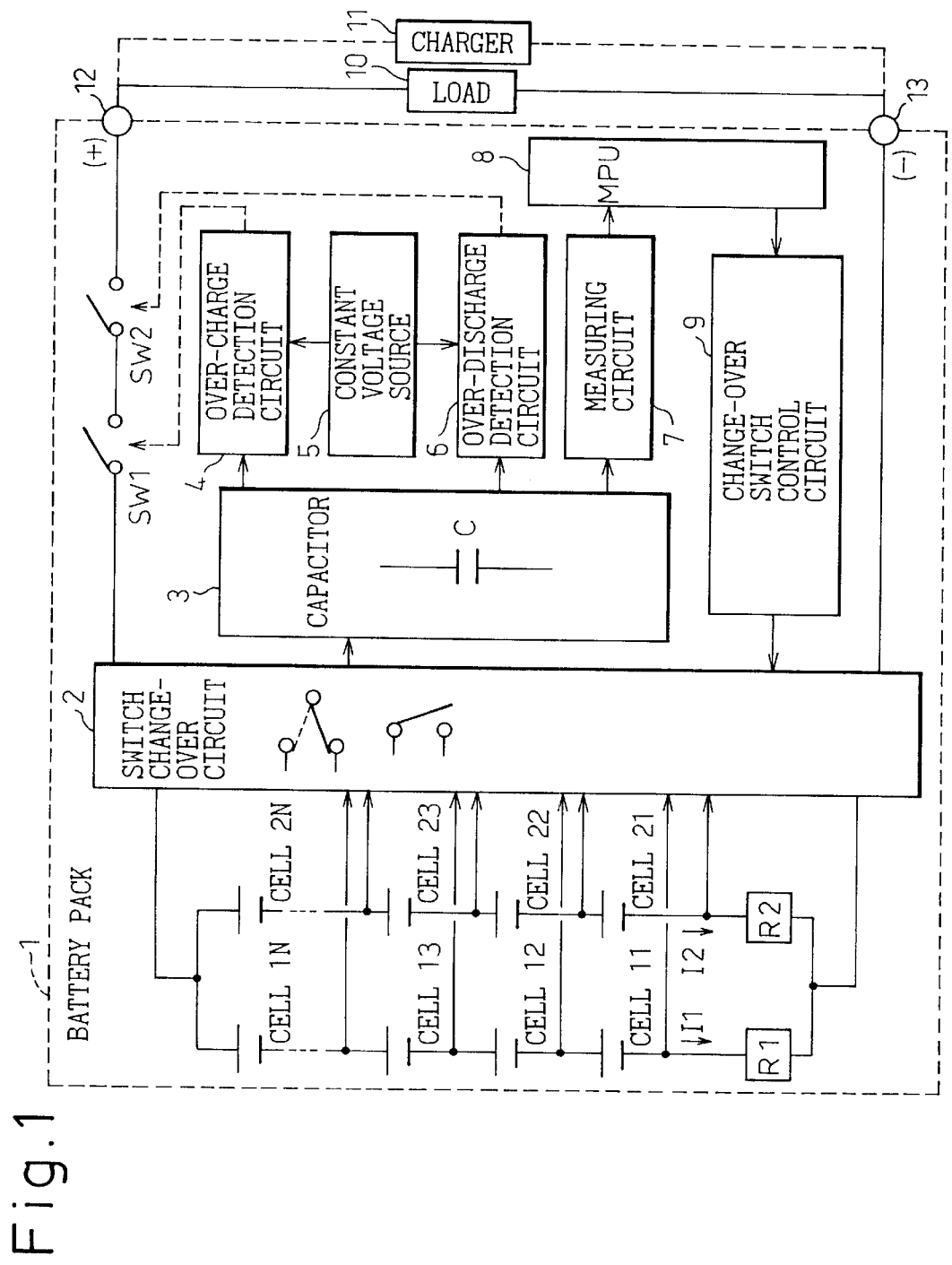
FIG. 1 is a diagram showing a system configuration of the present invention.

FIG. 1 is a diagram showing a configuration of the system according to this invention. In FIG. 1, a battery pack 1 includes a plurality of cells (battery cells) connected in series and/or parallel. In the case under consideration, the battery pack 1 includes a plurality of cells connected in series and parallel, a switch change-over circuit 2, a capacitor 3, an over-charge detection circuit 4, a constant voltage source 5, an over-discharge detection circuit 5, a measuring circuit 7, a MPU 8 and a change-over switch control circuit 9.

The cell group, as shown, includes cells (chargeable/dischargeable secondary battery cells) connected in series and parallel. The switch change-over circuit 2 is for connecting the two ends of one or a plurality of cells to the two ends of the capacitor 3, a charger 11 or a load 11, and is an analog switch, for example. The capacitor 3 is for retrieving and holding the voltage of one or a plurality of the cells.

The over-charge detection circuit 4 is for detecting the over-charge of the cells based on the voltage retrieved by the capacitor 3. The over-discharge detection circuit 6 is for detecting the over-discharge of the cells based on the voltage retrieved by the capacitor 3. The measuring circuit 7 is for measuring (detecting) the voltage across the capacitor 3.

The MPU 8 is for performing various control operations described below, based on the program written in a ROM not shown. The change-over switch control circuit 9 operates a corresponding switch making up the switch change-over circuit 2 shown in FIG. 2 and described later so that the two ends of one or a plurality of cells are connected to the two ends of the capacitor 3 thereby to charge a voltage to or retrieve a voltage from the capacitor 3, or the ends of one or a plurality of the cells are connected to the load 10 for discharge or connected to the charger 11 for charging.

Numerals R1, R2 are resistors arranged respectively for the trains of series-connected cells for detecting the current flowing in the cell trains. Numeral SW1 designates a switch for stopping the over-charge of the cells, and SW2 a switch for stopping the over-discharge of the cells.

The battery terminals (+), (−) are a positive terminal and a negative terminal, respectively, of the battery pack 1. The load 10 is for discharging one or a plurality of the cells. The charger 11 is for charging one or a plurality of the cells.

Figure 2:
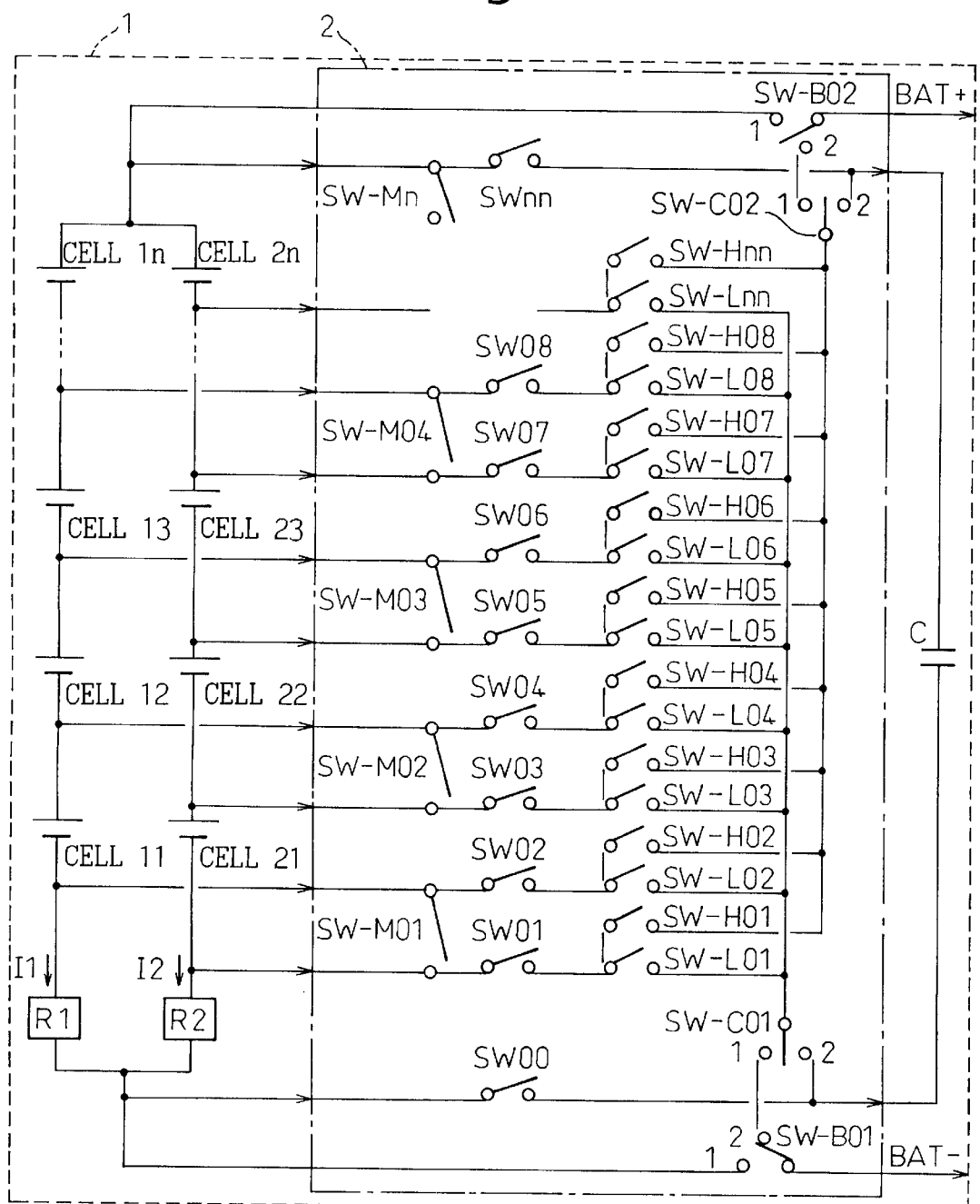
FIG. 2 is a diagram for explaining the configuration of a switch change-over circuit.

FIG. 2 is a diagram for explaining the configuration of the switch change-over circuit of FIG. 1. In FIG. 2, the cells 11, 12, ..., 1n constitute a first train of cells connected in series, and the cells 21, 22, ..., 2n make up a second train of cells connected in series. The first cell train and the second cell train are connected in parallel to each other and constitute one battery.

The switches SW are for connecting the two ends of one or an arbitrary number of cells to the two ends of the capacitor C or to the positive terminal (BAT+) of the battery shown at the upper end and the negative terminal (BAT−) of the battery at the lower end.

For connecting the two ends of the cell 22 to BAT+ and BAT− for charge or discharge, for example, the following series of connection is involved.

Positive electrode of cell 22 to SW05 (closed) to SW-H05 (closed) to SW-CO2 (turned to contact 1 side to SW-B02 (turned to contact 2 side) to BAT+.

Negative electrode of cell 22 to SW03 (closed) to SW-L03 (closed) to SW-CO1 (turned to contact 1 side) to SW-B01 (turned to contact 2 side) to BAT−.

In this way, the ends of the cell 22 are connected to the ends (BAT+ and BAT−) of the battery, the load is connected to BAT+ and BAT− for discharge, or the charger is connected to BAT+ and BAT− for charging. In the process, the current I2 flowing in the cells can be detected and controlled by detecting the voltage generated by the current flowing in the resistor R2 (for example, the constant current charge or the constant current discharge is controlled).

As described above, by closing the switches appropriately, one or a plurality of cells are connected to BAT+ and BAT−, and connected to a load or a charger thereby to charge or discharge any one cell or an arbitrary plural cells.

Also, by connecting the ends of the cell 22 to the ends of the capacitor C, for example, the voltage of the cell 22 can be retrieved as the voltage across the capacitor C through the following route.

Positive electrode of cell 22 to SW05 (closed) to SW-H05 (closed) to SW-CO2 (turned to contact 2 side) to positive electrode of capacitor C.

Negative electrode of cell 22 to SW03 (closed) to SW-L03 (closed) to SW-CO1 (turned to contact 2 side) to negative electrode of capacitor C.

In this way, the ends of the cell 22 are connected to the ends of the capacitor C, so that the voltage of the cell 22 is retrieved as the voltage across the capacitor C (charged and retrieved). In the process, the current I2 flowing in the cell can be detected by detecting the voltage generated by the current flowing in the resistor R2.

As described above, by closing the switches appropriately, one or a plurality of cells can be connected to the capacitor C for charging, the voltage can be retrieved, and the voltage can be measured (detected) by the measuring circuit described later. Also, SW00, SWnn designate the switches for retrieving the voltage of the whole of the first cell train and the second cell train into the capacitor C.

Figure 3A:
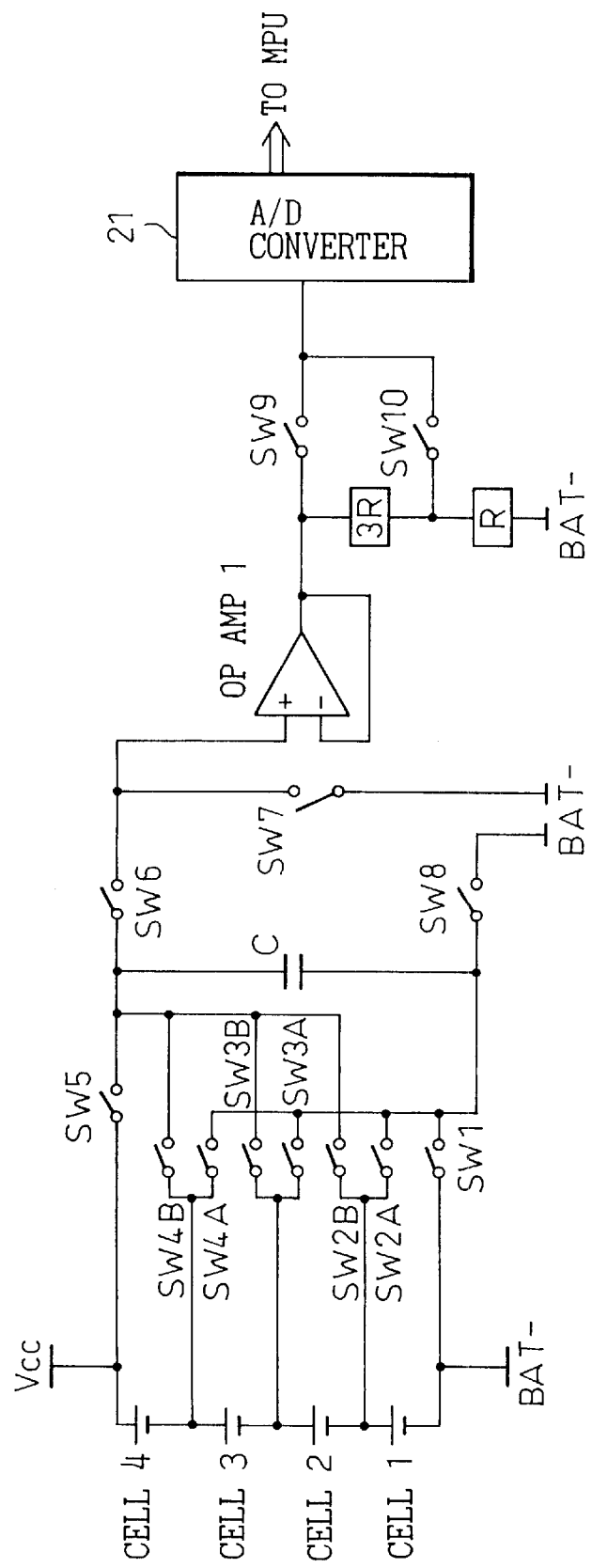
FIG. 3A is a diagram showing a first specific circuit example of the invention.

FIG. 3A shows a first specific example of the circuit according to the invention. In this example circuit, four cells including cell 1 to cell 4 are connected in series for simplicity's sake. In this case, as shown, the circuit includes a switch SW, a capacitor C, an OP amplifier 1 (such as an OP amplifier of voltage follower type) for preventing the instantaneous loss of the voltage (energy) retrieved into the capacitor C, voltage-dividing resistors 3R, R for dividing the voltage for the four cells, cell 1 to cell 4, into a voltage corresponding to one cell through the OP amplifier 1, and an A/D converter 21 for converting an analog voltage into a digital voltage and outputting it to the MPU 8.

FIG. 3B shows an example of a switch operation. This is a control table indicating that the operation described in the column "specific operation" can be performed by closing the switch described in the column "switch to be closed" and opening the switch described in the column "switch to be opened".

For detecting the terminal voltage (such as when charging the capacitor) of the cell 2 in item 2, for example, close the switches SW2A, SW3B, and
open the other switches.

As the result of this control operation, the terminal voltage of the cell 2 is charged across the capacitor C and retrieved by the capacitor C. Specifically, the connection is established through the following route.

Positive electrode of cell 2 to Sw3B (closed) to positive electrode of capacitor C.

Negative electrode of cell 2 to SW2A (closed) to negative electrode of capacitor C.

As a result, the voltage of cell 2 is charged and retrieved into the capacitor C and detected.

Also, when measuring (with ADC) a single cell in item 6, i.e. when converting the voltage of the single cell into a digital voltage value with the A/D converter 21, the following control operation is performed.

Close the switches SW6, SW8, SW9.
Open the remaining switches.

In this way, the voltage retrieved by charging into the capacitor C is held by use of the OP amplifier 1, converted into a digital voltage value by the A/D converter 21, and output to the MPU 8.

Specifically, the connection is established through the following route.

Positive electrode of capacitor C to SW6 (closed) to OP amplifier 1 to SW9 (closed) to positive terminal of A/D converter.

Negative electrode of capacitor C to SW8 (closed) to BAT− to negative terminal of A/D converter.

By this connection, the voltage retrieved by the capacitor C is converted into a digital voltage value and output to the MPU 8.

Also, when measuring the whole battery pack in item 7 (measuring with ADC), i.e. when converting the whole voltage of cells 1 to 4 into a digital voltage value by the A/D converter 21, the following control operation is performed.

Close the switches SW6, SW8, SW10.
Open the remaining switches.

In this way, the voltage from cells 1 to 4 retrieved by being charged into the capacitor C is input to and held in the OP amplifier 1, and divided into one fourth by the voltage dividing resistors 3R, R, so that a voltage substantially equal to the voltage of one cell is converted into a digital voltage value and output to the MPU 8.

Specifically, the connection is established through the following route.

Positive electrode of capacitor C to SW6 (closed) OP amplifier 1 to dividing resistors 3R, R to SW10 (closed) to positive terminal of A/D converter Negative electrode of capacitor C to SW8 (closed) to BAT− to negative terminal of A/D converter.

As a result, the voltage retrieved into the capacitor C, after being divided into one fourth to a value substantially equal to the voltage of one cell, is converted into a digital voltage value and output to the MPU 8. Thus, even in the case where the number of cells increases, the voltage input to the A/D converter 21 is kept substantially within the voltage range of one cell, and therefore the accuracy of the A/D converter can be effectively utilized.

Also, when calibrating (adjusting) the zero voltage in item 8, i.e. when correcting the offset of the OP amplifier 1, the following control operation is performed.

Close switches SW7, SW9.
Open the remaining switches.

By thus doing, the voltage value converted into a digital signal by the A/D converter 21 while shorting the input terminal of the OP amplifier 1 constituting an analog amplifier is output to the MPU 8 and the voltage value thereof is stored. With the stored voltage value as a reference (zero voltage), the voltages measured subsequently can be corrected (offset correction).

Also, with other items, the detection and measurement described in the column "specific operation" can be carried out by operating the switches in the manner described in the column "switches to be closed".

Figure 4A:
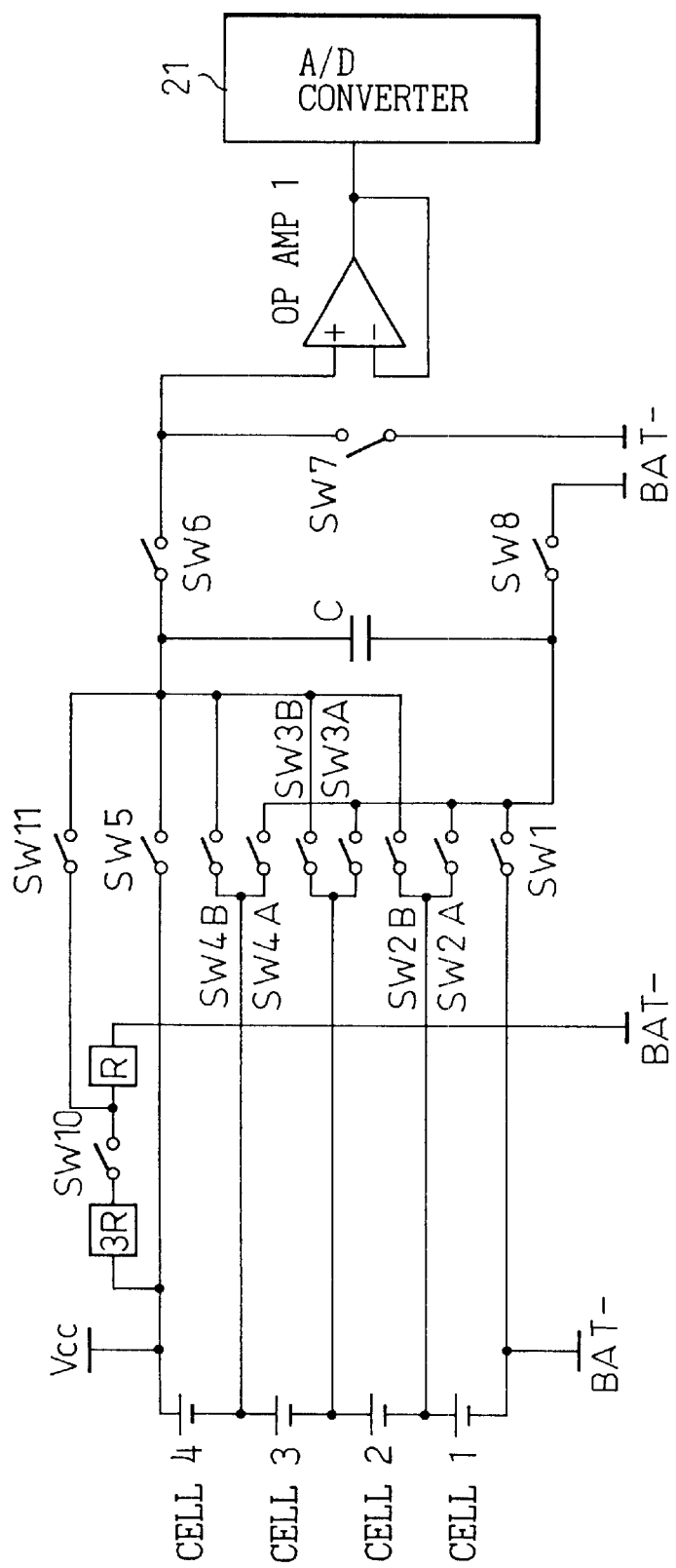
FIG. 4A is a diagram showing a second specific circuit example of the invention.

FIG. 4A shows a second specific example of the circuit according to the invention. In the circuit of this example, the voltage of cells 1 to 4 is divided into one fourth by the dividing resistors 3R and R of FIG. 4A, charged into the capacitor C and retrieved (detected), unlike in the specific example shown in FIG. 3A in which the output voltage (the voltage charged into the capacitor C and retrieved as the whole voltage of the four cells 1 to 4) of the OP amplifier 1 is divided into one fourth by the dividing resistors 3R and R into a voltage substantially corresponding to one cell, input to the A/D converter 21, and converted into a digital voltage value.

As a result, the analog voltage retrieved from the capacitor C and input through the OP amplifier 1 to the A/D converter 21 for all the cells 1 to 4 represents an amount corresponding substantially to a single cell in the same manner as the case where the analog voltage is retrieved from each of the single cells 1, 2, 3, 4. Thus, the analog-to-digital conversion efficiently utilizes the accuracy of the A/D converter 21. The operation of the other parts in FIG. 4B is similar to the corresponding switching operation in FIG. 3B and will not be explained.

Now, the operation of sequentially detecting each voltage of the cells 11, 12, . . . , 1n, 21, 22, . . . , 2n and the whole voltage of the cells in the circuit of FIG. 5 will be explained in detail with reference to the flowchart of FIGS. 6 and 7.

Figure 5:
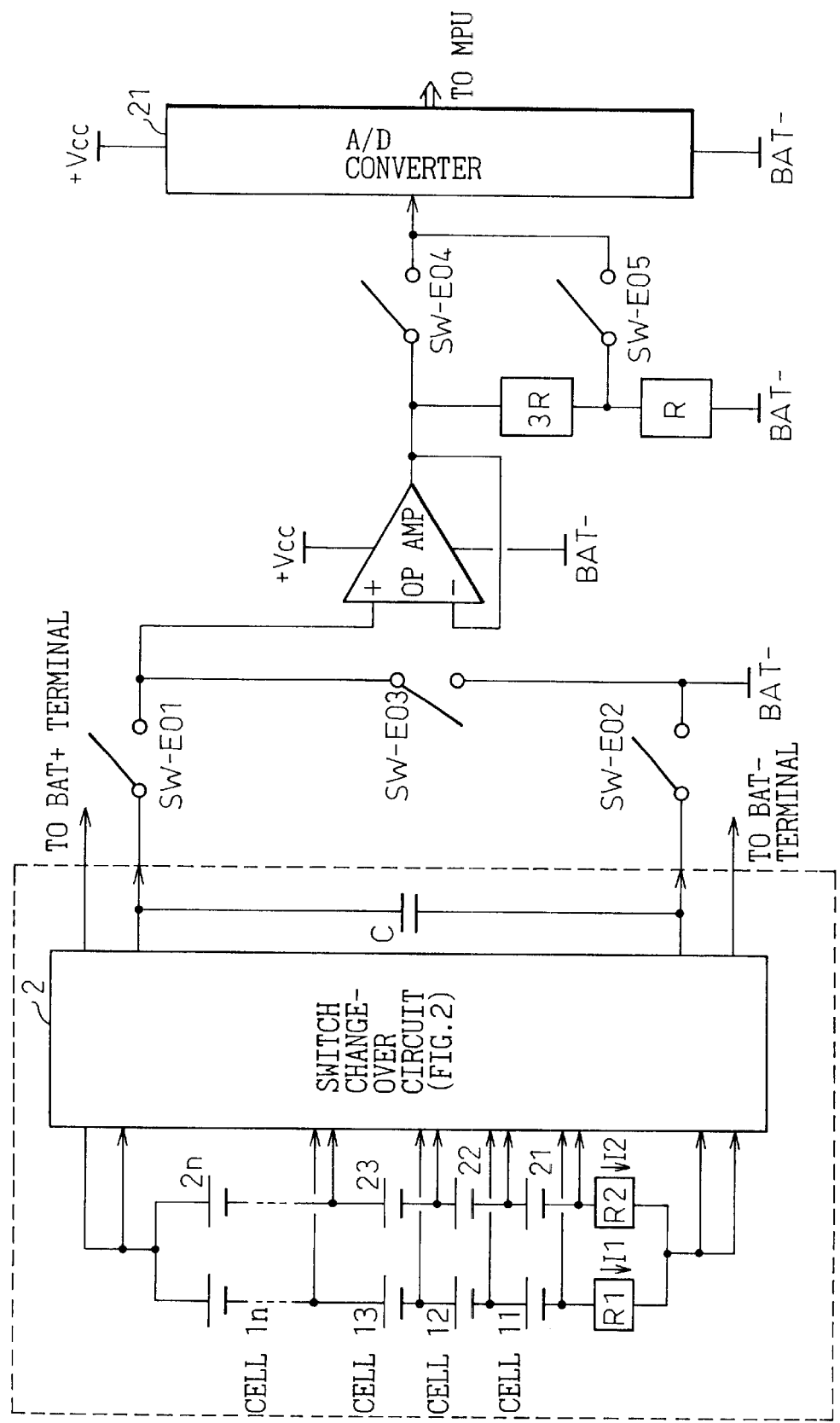
FIG. 5 is a diagram showing a third specific circuit example according to the invention.

FIG. 5 shows a third specific example of the present invention. In FIG. 5, a cell train including cells 11, 12, 13, . . . , 1n connected in series and a cell train including cells 21, 22, 23, . . . , 2n connected in series are connected in parallel to each other thereby to constitute a battery (battery pack).

The switch change-over circuit 2, which is identical to the switch change-over circuit 2 of FIG. 2, is for connecting the ends of one or an arbitrary plural ones of cells 11, 12, 13, . . . , 1n and cells 21, 22, 23, . . . , 2n to the ends of the capacitor C, the load 10 or the charger 11 (FIG. 1).

The capacitor C is connected to one, plural or all the cells for holding the voltage thereof (by charging). The OP amplifier is for preventing instantaneous loss of the voltage held in the capacitor C. Characters 3R and R designate an example of voltage dividing resistors, in which a detection voltage higher than that of a single cell such as the whole voltage of the cells 11 to 1n or the cells 21 to 2n is divided into a voltage substantially equal to the voltage of a single cell (for example, the dividing resistors divide the signal to 1/n).

The A/D converter 21 is for converting an analog voltage to a digital voltage, and outputs it to the MPU 8. Reference character SW designates switches adapted to open or close for connection or disconnection, and are analog switches, for example.

Figure 6:
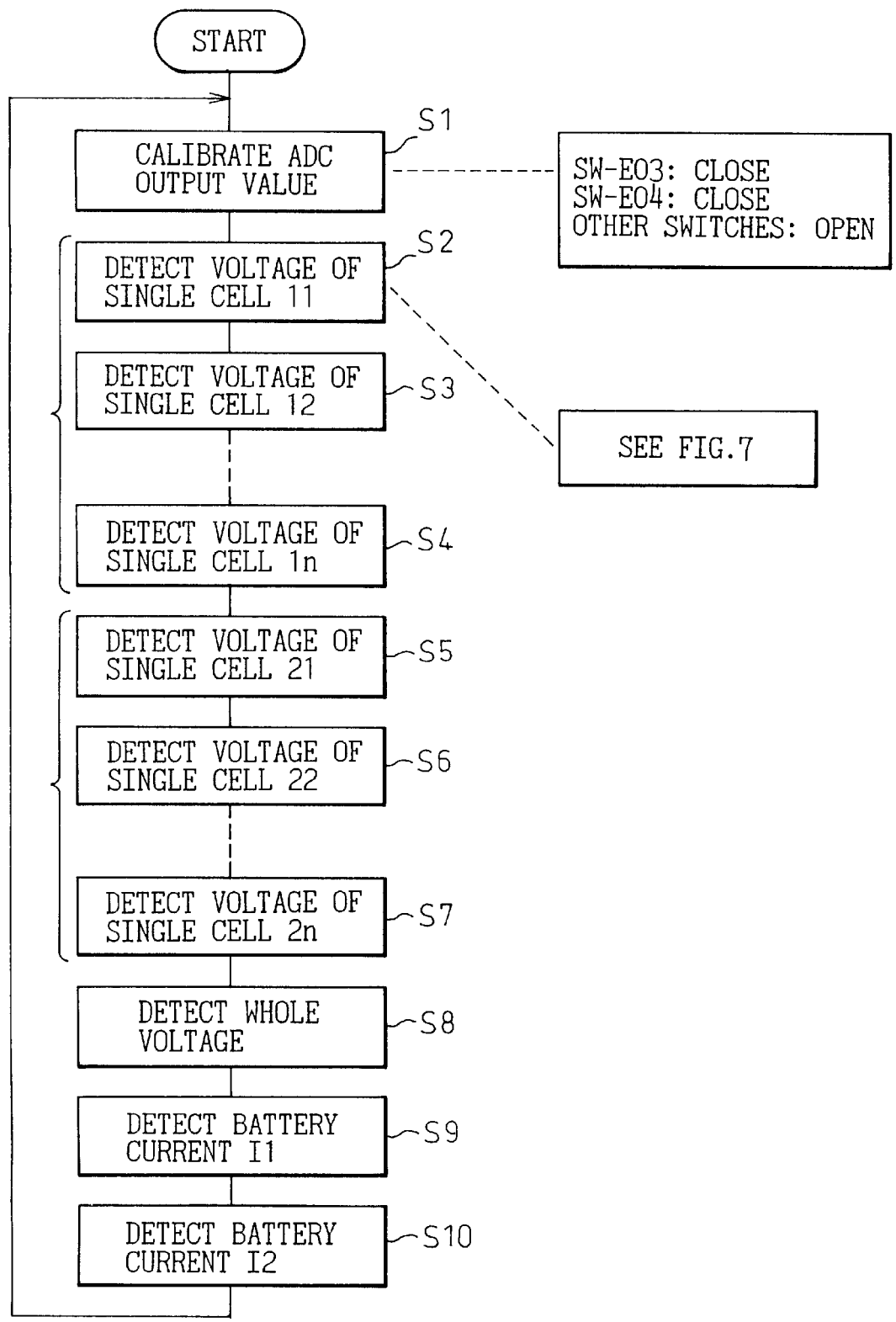
FIG. 6 is a flowchart for explaining the general operation of the invention.

FIG. 6 is a flowchart for explaining the operation of the invention. In FIG. 6, the ADC output value is calibrated in step S1. This operation is performed in such a manner that, as described on the right side, the switches SW-E03 and SW-E04 are closed while the remaining switches are open, the input terminal of the OP amplifier is shorted, and the corresponding output voltage of the OP amplifier is input to the A/D converter 21. The resulting digital voltage value is notified to the MPU 8 and stored (as an offset value), and with reference to the voltage thus stored, the digital voltage value measured subsequently is corrected (offset is corrected).

In step S2, the voltage of a single cell 11 is detected. For this purpose, in steps S11 to S13 of FIG. 7 described later, the ends of the cell 11 are connected to the ends of the capacitor C so that the voltage is retrieved by charging the capacitor C. Then, the voltage of the capacitor C is held using the OP amplifier, and converting it to a digital voltage value in the A/D converter 21, the MPU 8 is notified. Thus, the voltage is corrected (calibrated) with the stored offset value thereby to calculate the correct digital voltage of the single cell 11. As the last step, the capacitor C is discharged in preparation for the next measurement.

In step S3, the voltage of the single cell 12 is detected. Specifically, the voltage of the single cell 12 is detected in a manner similar to step S2. The process of steps S4 to S7 is also similar.

In step S8, the whole voltage is detected. For this purpose, as described above, in FIG. 5, the switches are controlled in such a manner as to retrieve a voltage by charging the capacitor C with the whole voltage of the parallel circuit of the cell train including the cells 11 to 1$n$ in series and the cell train including the cells 21 to 2$n$ in series. Then, the voltage of the capacitor C is amplified in the OP amplifier, and then by being divided into 1/n with the dividing resistors 3R and R, set to a value almost equal to the voltage of a single cell, which voltage is input to the A/D converter 21 and converted into a digital voltage value. The resulting voltage is notified to the MPU 8 for offset correction, thereby calculating the correct voltage value for the whole cells.

In step S9, the battery current I1 is detected. For this purpose, the voltage across the resistor R1 connected in series to the cells 11 to 1$n$ in FIG. 5 is charged to the capacitor C and retrieved. Then, the voltage of the capacitor C is amplified by the OP amplifier, after which the signal is input to the A/D converter 21 for conversion into a digital voltage value, and notified to the MPU 8 for offset correction, thereby calculating the correct current value I1.

In step S10, the battery current I2 is detected. For this purpose, as in step S9, the voltage across the resistor R2 connected in series to the cells 21 to 2$n$ in FIG. 5 is charged to the capacitor C and retrieved. Then, the voltage of the capacitor C is amplified by the OP amplifier, input to the A/D converter 21 for conversion into a digital voltage value, and notified to the MPU 8 for offset correction, thereby calculating the correct value of the current I2. Then, the process of and subsequent to step S1 is repeated.

As the result of this operation, the digital voltage value of each of the cells 11 to 1$n$, each of the cells 21 to 2$n$ and the whole cells in FIG. 5, the digital current value of the current flowing from the cell 11 to 1$n$, from the cell 21 to 2$n$ can be measured accurately with a simple circuit configuration using only a simple offset calibration.

Figure 7:
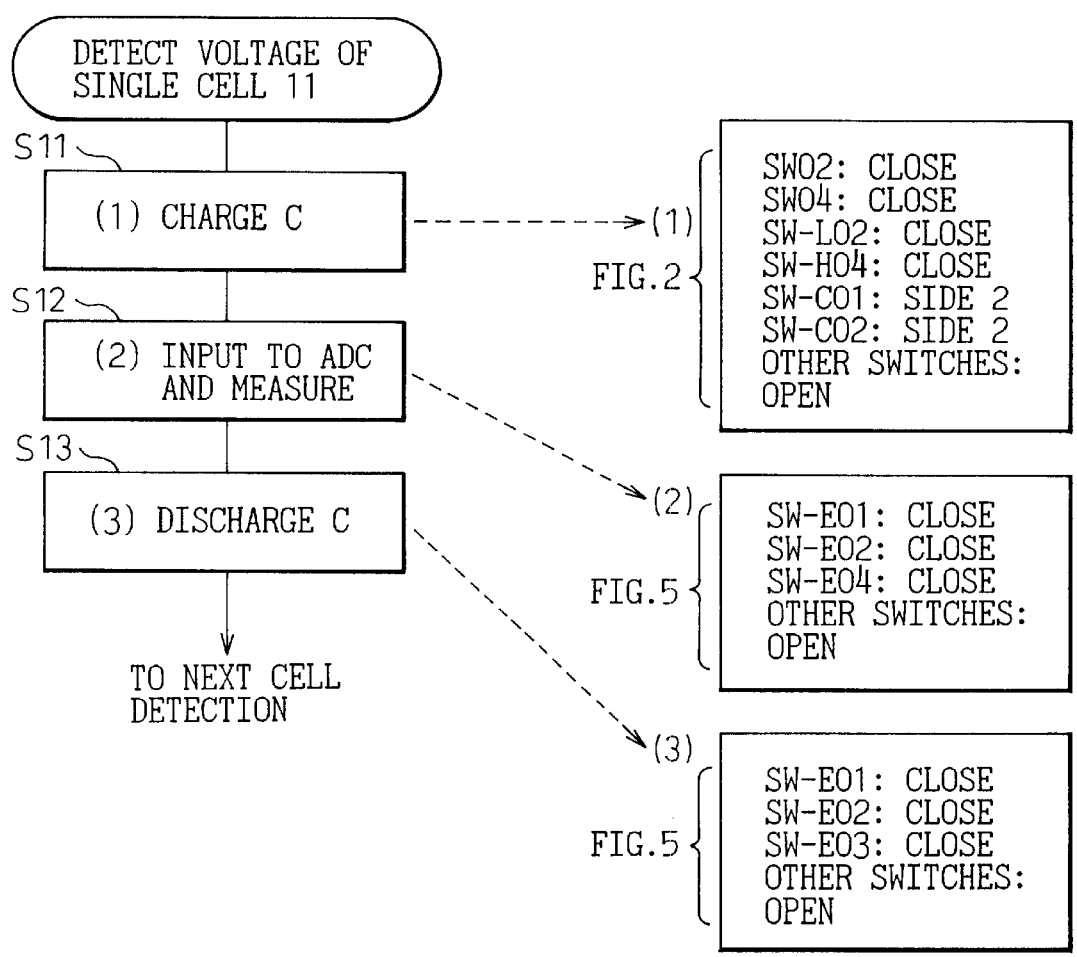
FIG. 7 is a diagram for explaining the detailed operation of the invention.

FIG. 7 is a diagram for explaining a detailed operation, and shows an example of switch operation for sequentially detecting the voltage of the single cells in the circuit configuration of FIG. 5. The left side of FIG. 7 shows a flowchart, and the right side of FIG. 7 an example of switch operation.

In step S11 (1), the capacitor C is charged. For this purpose, as described in the corresponding block (1) on the right side, the corresponding switches of the switch change-over circuit 2 (specifically, the switch change-over circuit 2 shown in FIG. 2) shown in FIG. 5 are controlled (the switches SW02, SW04, SW-L02, SW-L04 are closed, while the switches SW-C01 and SW-C02 are turned to 2, and the other switches are all opened). As a result, the ends of the cell 11 are connected with the ends of the capacitor C, so that the capacitor C is charged and the voltage is retrieved.

In step S12 (2), the signal is input to the ADC and measured. For this purpose, as described in the corresponding block (2) on the right side, the corresponding switches of the switch change-over circuit 2 in FIG. 5 are controlled (the switches SW-E01, SW-E02, SW-E04 are closed, while the other switches are all open), so that the voltage of the capacitor C is held by use of the OP amplifier, input to the A/D converter 21 and, by thus being converted into a digital voltage value, notified to the MPU 8 for offset correction, thereby detecting (measuring) the correct voltage value of the cell 11.

In step S13 (3), the capacitor C is discharged. For this purpose, as described in the corresponding block (3) on the right side, the corresponding switch of the switch change-over circuit 2 of FIG. 5 is controlled (the switches SW-E01, SW-E02, SW-E03 are closed, while the other switches are all opened), so that the cell 11 is discharged in preparation for measuring the voltage of the next cell. Then the process proceeds to the detection of the next cell.

As described above, the capacitor C is connected and charged for each single cell to thereby retrieve the voltage, the voltage of the capacitor C is converted into a digital voltage by the A/D converter 21 and notified to the MPU 8 for offset correction thereby to calculate the correct voltage value, and then the capacitor C is discharged in preparation for the next measurement. By repeating this process, it becomes possible to accurately measure the voltage of a single cell, the voltage of the whole cells and the value of the current flowing in the cells with the simple circuit configuration shown in FIG. 5.

Figure 8:
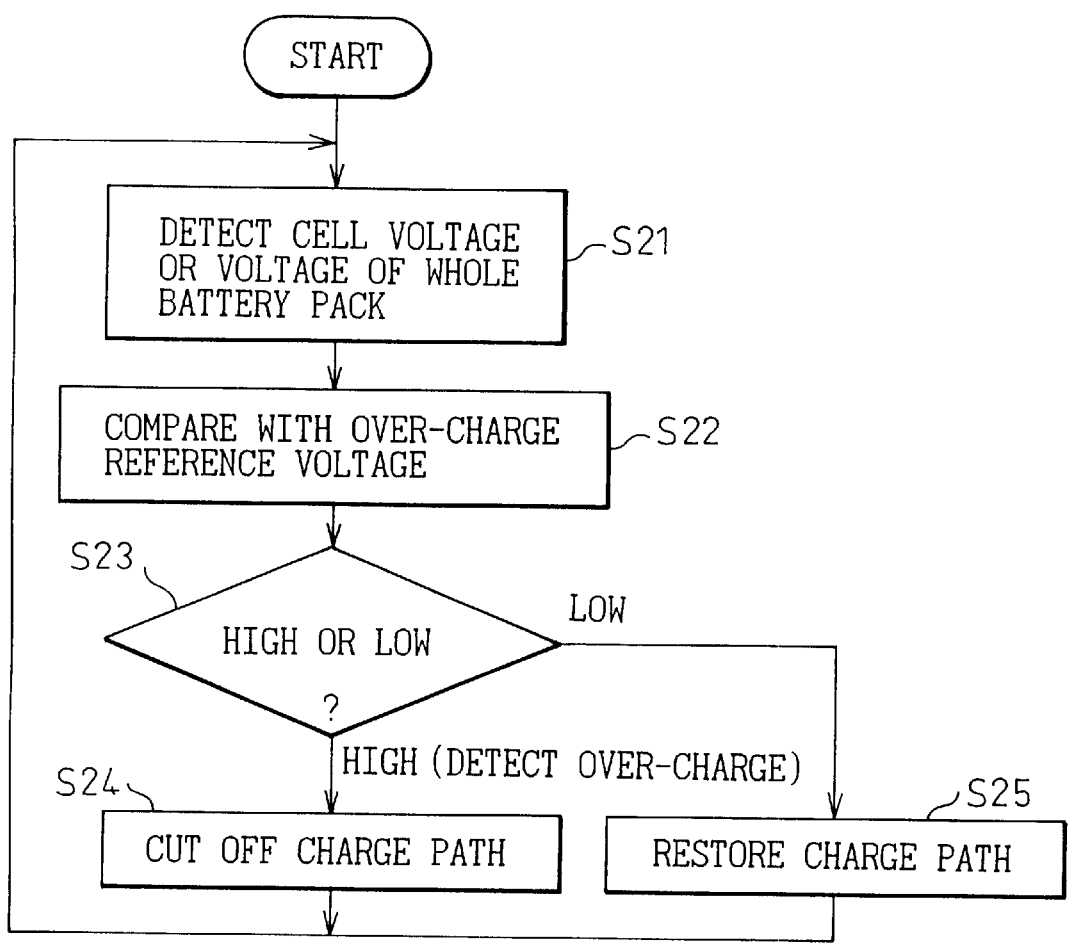
FIG. 8 is a flowchart for the over-charge detection operation according to the invention.

FIG. 8 is a flowchart for explaining the operation of detecting an over-charge according to this invention. In FIG. 8, step S21 is for detecting the cell voltage or the voltage of the whole battery pack. In the process, the voltage of the single voltage or the voltage of all the cells, as the case may be, is detected in accordance with the flowchart of FIG. 6 described above.

In step S22, the current value the voltage of a single cell or the voltage of the whole cells measured in step S21 is compared with an over-charge reference voltage predetermined by an experiment (or an over-charge reference voltage determined by the cell manufacturer) for the single cell or all the cells.

In step S23, the relative size is determined from the result of the comparison. In the case where the current value is higher, it follows that an over-charge has been detected, and therefore the charge path is cut off (the switch for the charge path is turned off) in step S24, thus stopping the charging, and the process returns to step S21. In the case where the current value is lower, on the other hand, an over-charge is not involved but charging is possible. In step S25, therefore, the charge path is restored, and the charge is started as required, followed by returning to step S21. Though not shown, in the case where it is found that no over-charge is involved nor charge is needed, the charge path is not normally cut off.

As the result of the foregoing operation, the voltage of a single cell or all the cells is measured, so that the charge path of the over-charged cells or all the cells can be cut off or the charge path for the cell or all the cells requiring charging can be restored.

Figure 9:
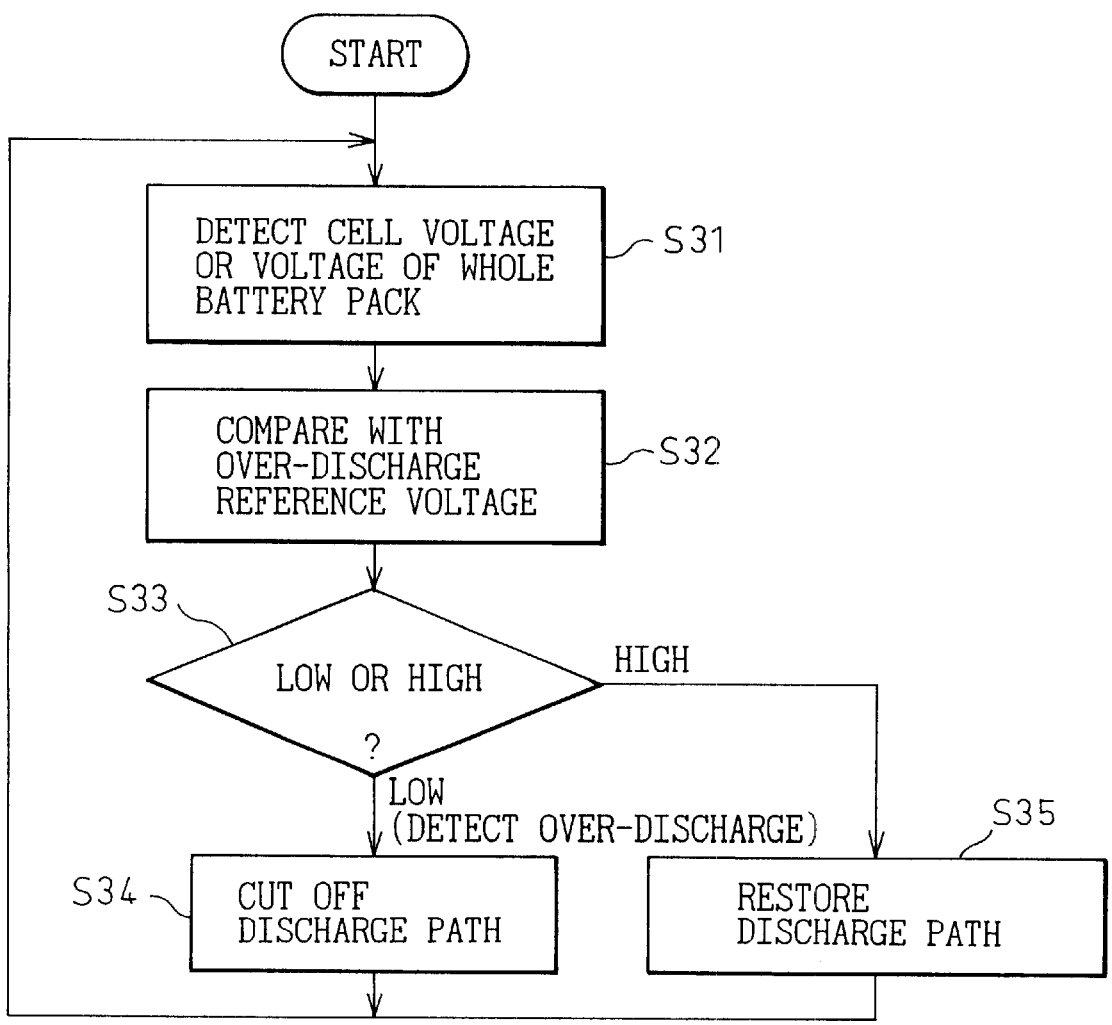
FIG. 9 is a flowchart for the over-discharge detection operation according to the invention.

FIG. 9 is a flowchart for explaining the operation of detecting an over-discharge according to the invention. In FIG. 9, the voltage of a single cell or the voltage of the whole battery pack including all the cells is detected in step S31 in accordance with the flowchart Fog. 6.

In step S32, the current value of the voltage of the single cell or the voltage of all the cells measured in step S31 is compared with an over-discharge reference voltage predetermined experimentally (or an over-discharge reference voltage determined by the cell manufacturer) for the single cell or all the cells, as the case may be.

In step S33, it is determined which voltage value is higher or lower from the result of comparison. In the case where the current value is lower, it follows that an over-discharge is detected, and therefore the discharge path is cut off (the discharge path switch is opened) in step S34 thereby to stop the discharge, followed by returning to step S31. In the case where the current value is higher, on the other hand, a dischargeable situation but not an over-discharge is detected. Therefore, in step S35, the discharge path is restored, and in some cases, the discharge is started, followed by a return to step S31. Though not shown, in the case where neither the over-discharge nor the need of discharge is found, the discharge path is not normally cut off.

In the way described above, the voltage of a single cell or all the cells is measured, and the discharge path for a cell or all the over-discharged cells is cut off, while the discharge path for a cell or all the whole cells requiring discharge can be restored.

Figure 10:
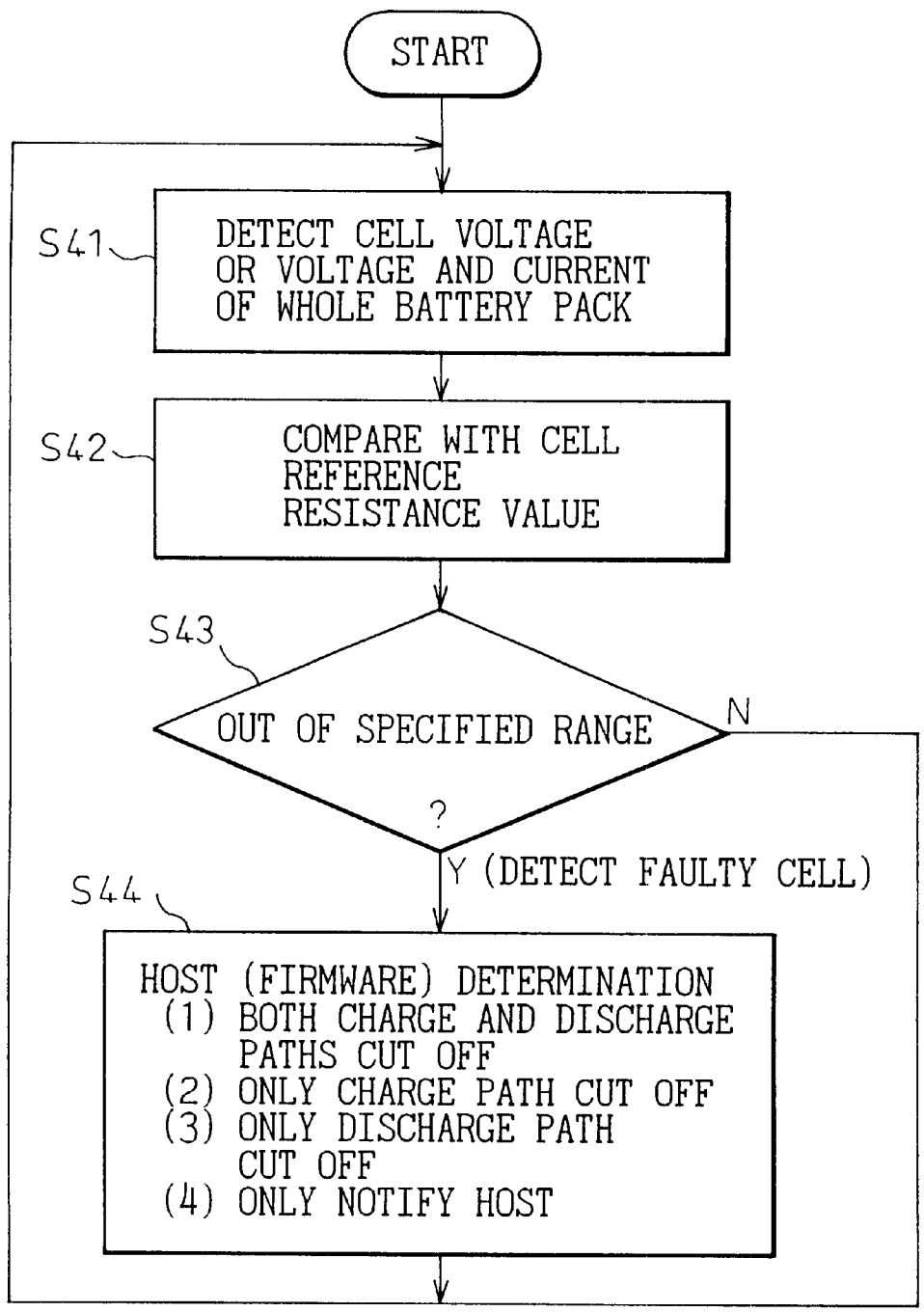
FIG. 10 is a flowchart for the operation of detecting a faulty cell according to the invention.

FIG. 10 is a flowchart for explaining the operation of detecting a faulty cell according to the invention. In step S41 of FIG. 10, the single cell voltage or the voltage and current of the whole battery pack are detected. In the process, in accordance with the flowchart of FIG. 6 described above, the voltage of the single cell or the voltage and current of all the cells are detected.

Specifically, in step S42, the voltage Vcell of the single cell, and the current Icell of the single cell detected in step S41 are substituted into the equation Rcell=Vcell/Icell thereby to determine the cell internal resistance Rcell, which is compared with a reference resistance value (or the cell reference resistance value determined by the cell manufacturer) of the single cell predetermined by experiment.

In step S43, it is determined whether the result of comparison is out of a specified range. In the case where the answer is YES, it indicates that the result of comparison is not included in the specified range, and the process proceeds to step S44. In the case where the answer is NO, the process returns to step S41.

Since a faulty cell is detected in step S43, one of the following operations is performed in step S44.

(1) cut off both the discharge and charge paths (2) cut off only the charge path, (3) cut off only the discharge path, or (4) only notify the host The result of comparison obtained in step S43 answered as YES is not included in the specified range in the following cases.

In the case where Rcell is considerably smaller than the reference resistance value, it is highly likely that the cell has been internally shorted.

In the case where Rcell is considerably larger than the reference resistance value, a contact failure of the internal electrodes of the cell has most probably occurred.

As described above, the voltage of a single cell or the voltage and current of the whole cells are measured, and the voltage/current is calculated to determine a cell internal resistance, which is compared with a reference resistance value. In the case where the result of comparison is not included in a specified range, the case of a shorted cell or a cell contact failure is determined. Then, the charge/discharge circuit can be cut off, the charge circuit can be cut off, the discharge path can be cut off, or the host can notified appropriately.

Figure 11A:
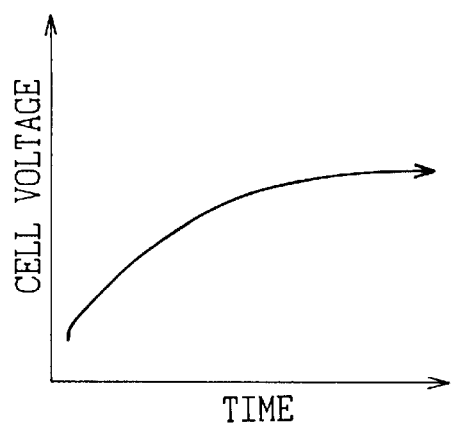
FIG. 11A is a characteristic diagram showing an example of the cell charge characteristic according to the invention.
Figure 11B:
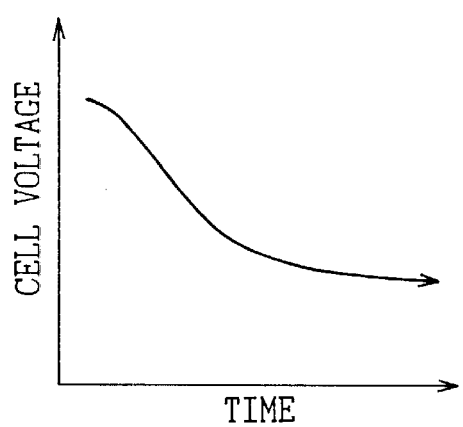
FIG. 11B is a characteristic diagram showing an example of the cell charge characteristic according to the invention.

FIGS. 11A and 11B show an example of the charge/discharge characteristic according to this invention. FIG. 11A shows an example of the charge characteristic. The abscissa represents the charging time, and the ordinate the cell voltage. The cells used in the experiment according to the invention have such a characteristic that the cell voltage increases with time, the cells are saturated at a specified value, and when the specified value is reached, the charge to the cell is stopped. Depending on the particular cell, the cell voltage gradually increases with time and when dropping, the cell is fully charged. The shown characteristic, therefore, is only one of the cell characteristics, and the detection of the over-charge/over-discharge is required to be detected according to the existing cell characteristic.

FIG. 11B shows an example of the discharge characteristic. The abscissa represents the discharge time, and the ordinate the cell voltage. In the cells used for the experiment according to the invention, as shown, the cell voltage decreases with time and when it reaches a specified value, the cell discharge stops.

Figure 12:
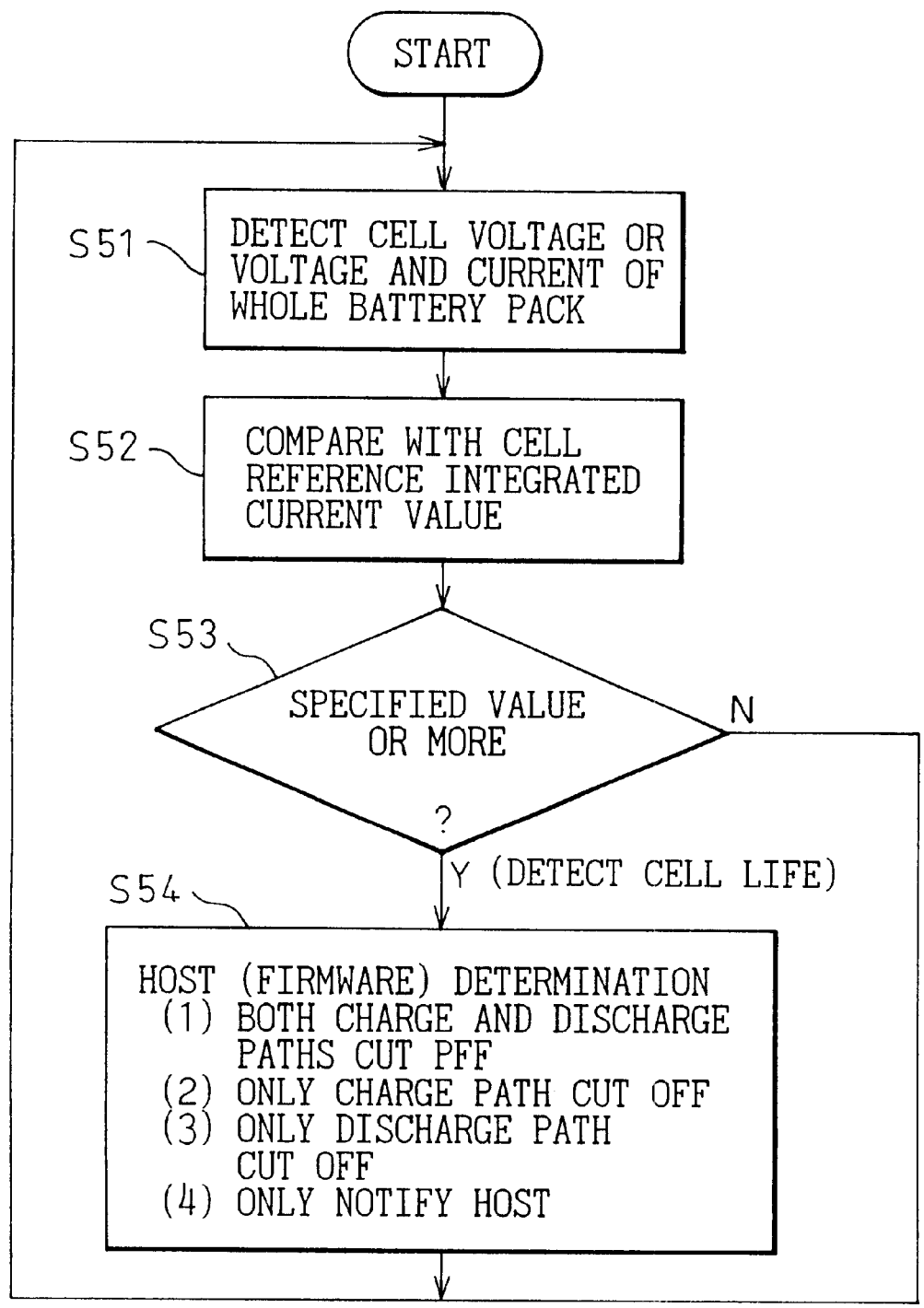
FIG. 12 is a flowchart for the operation of detecting the cell life according to the invention.

FIG. 12 is a flowchart for explaining the operation of cell life detection according to the invention. In step S51 of FIG. 12, the cell voltage or the voltage and current for the whole battery pack are detected. For this purpose, in accordance with the flowchart of FIG. 6, the voltage of the single cell or the voltage and current of all the cells are detected.

In step S52, the current value of the single cell detected in step S51 is integrated, and the resulting integrated current value is compared with a cell reference integrated current value predetermined experimentally by chemical factors. In step S53, it is determined whether the integrated current value is a specified value. In the case where the answer is YES, it is found that the detected integrated current value is not less than the reference integrated current value and the cell life has expired. Then the process proceeds to step S54. In the case where the answer is NO, on the other hand, the cell life is not yet reached, and the process returns to step S51.

It is found in step S53 that the cell life has expired, and therefore in step S54, (1) both the charge and discharge paths are cut off, (2) only the charge path is cut off, (3) only the discharge path is cut off, or (4) only a notification is given to the host.

As described above, by measuring the voltage of a single cell or the voltage and current of the whole cells, it can be determined that a given cell is faulty in the case where the integrated value of the current has exceeded a cell reference integrated current value, in which case the charge/discharge circuit is cut off, the charge circuit is cut off, the discharge circuit is cut off or the host is notified.

Figure 14:
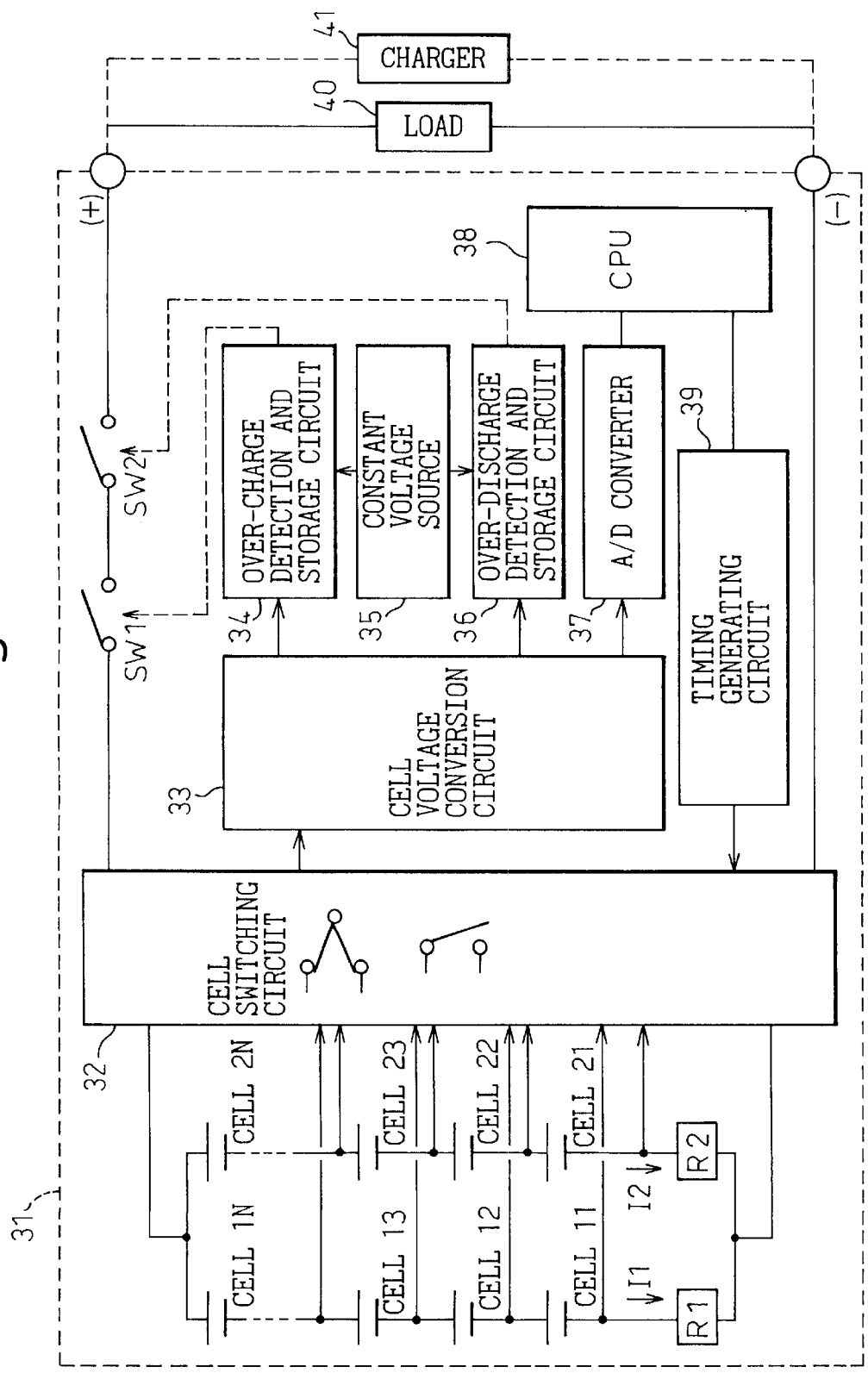
FIG. 14 is a diagram showing another system configuration according to the invention.

FIG. 14 is a diagram showing another system configuration according to the invention. In FIG. 14, the battery pack 31 includes a group of cells (battery cells) connected in series and parallel. In the case under consideration, the battery pack 31 includes a plurality of cells connected in series and parallel, a cell switching circuit 32, a cell voltage conversion circuit 33, an over-charge detection and storage circuit 34, a constant voltage source 35, an over-discharge detection and storage circuit 36, an A/D converter 37, a CPU 38 and a timing generating circuit 39.

The cell group, as shown, is a group of cells (cells of a chargeable/dischargeable secondary battery) connected in series and parallel. The cell switching circuit 32 is for connecting the ends of one or a plurality of cells to the ends of the cell voltage conversion circuit 33 (such as a capacitor), the charger 41 or the load 40, and is configured with an analog switch or the like.

The cell voltage conversion circuit 33 is for retrieving and holding the voltage of one or a plurality of cells, and is a capacitor C, for example. The over-charge detection and storage circuit 34 is for detecting and storing the over-charge of the cell based on the voltage retrieved by the capacitor C as an example of the cell voltage conversion circuit 33. The constant voltage source 35 provides a reference voltage for detecting an over-charge or an over-discharge. The over-discharge detection and storage circuit 36 is for detecting and storing an over-discharge based on the voltage retrieved by the capacitor C providing an example of the cell voltage conversion circuit 33.

The A/D converter 37 is for converting the analog voltage across the capacitor C providing an example of the cell voltage conversion circuit 33 into a digital voltage, and notifying the CPU 38. The CPU 38 is a processor for performing various control operations described below, based on the program stored in a ROM or the like not shown.

The timing generating circuit 39 is for connecting the ends of one or a plurality of the cells to the ends of the capacitor C providing an example of the voltage conversion circuit 33 by operating the switches making up the cell switching circuit 32 in response to a command from the CPU 38, and retrieving a voltage by charging the capacitor C, or connecting the ends of one or a plurality of cells to the load 40 for discharge, or connecting the ends of one or a plurality of cells to the charger 41 for charging.

Numerals R1 and R2 designate current sense resistors provided for each train of cells connected in series for detecting the current flowing in the particular cell train.

Numeral SW1 designates an over-charge protection switch for stopping the over-charging of the cell. Numeral SW2 designates an over-discharge protection switch for stopping the over-discharge of the cell. The battery terminals (+) and (−) are positive and negative terminals, respectively, of the battery pack 31. The load 40 is for discharging one or a plurality of cells. The charger 41 is for charging one or a plurality of cells.

Figure 15:
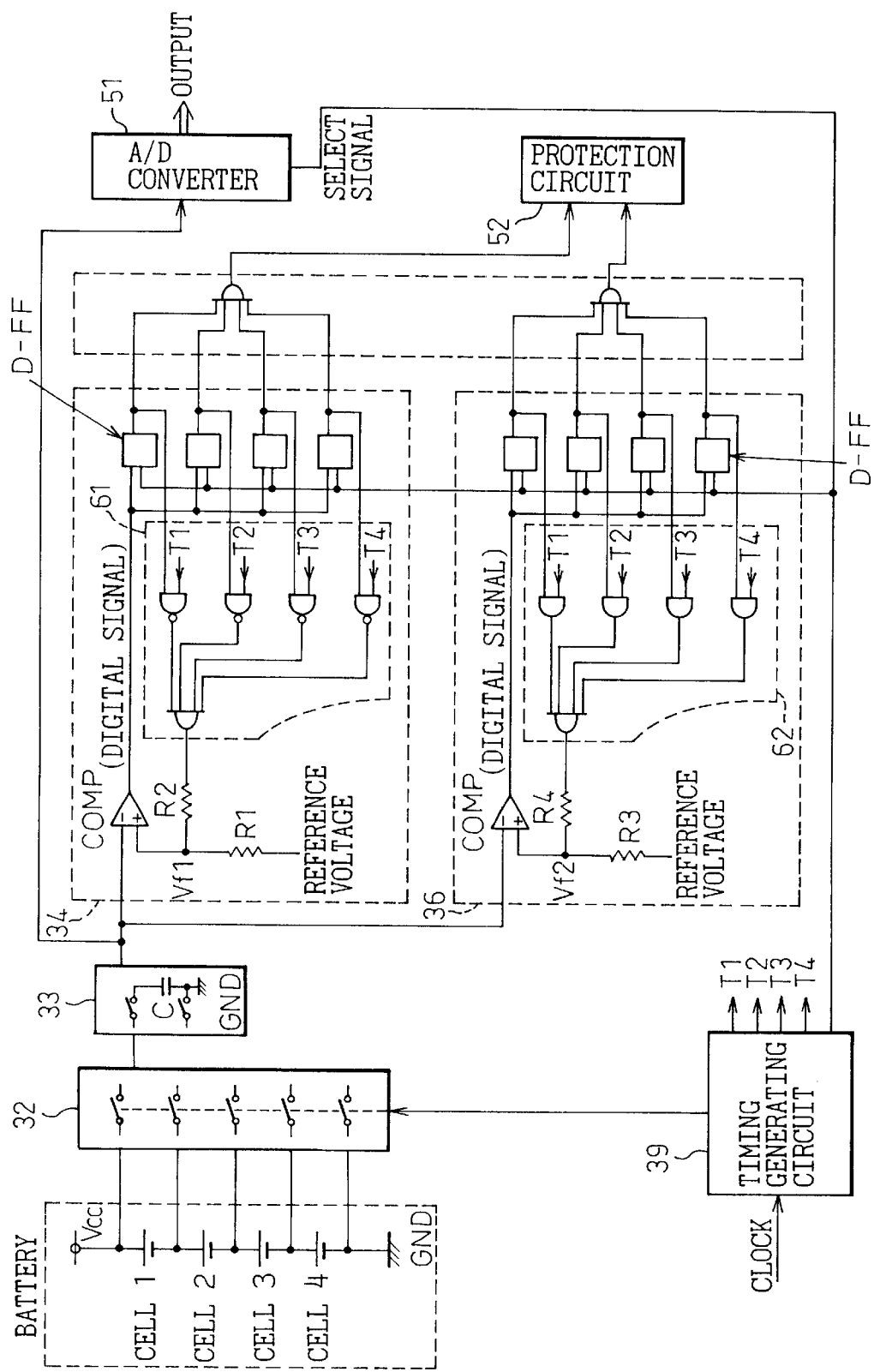
FIG. 15 is a circuit diagram according to another embodiment of the invention.

FIG. 15 is a circuit diagram according to another embodiment of the invention, and shows a specific example of the over-charge detection and storage circuit 34 and the over-discharge detection and storage circuit 36 shown in FIG. 14. In the case under consideration, the battery is configured with four cells including a cell 1, a cell 2, a cell 3 and a cell 4.

In FIG. 15, the over-charge detection and storage circuit 34 is for detecting an over-charge and is configured with a comparator COMP, a storage circuit D-FF and a hysteresis voltage adding circuit 61.

The comparator COMP is for comparing the voltage of the capacitor C constituting the cell voltage conversion circuit 33 with a reference voltage ((Vf1 in FIG. 19) determined by other reference voltages, resistors R1, R2 and the output voltage (0 V or 5 V, for example) of the hysteresis voltage adding circuit 61), and outputs the result of comparison.

The storage circuit D-FF is configured with four units corresponding to cells 1, 2, 3, 4 for storing the result of comparison by the comparator COMP in the cells 1, 2, 3, 4 in synchronism. The output of the storage circuit D-FF is input to the hysteresis voltage adding circuit 61.

Figure 19:
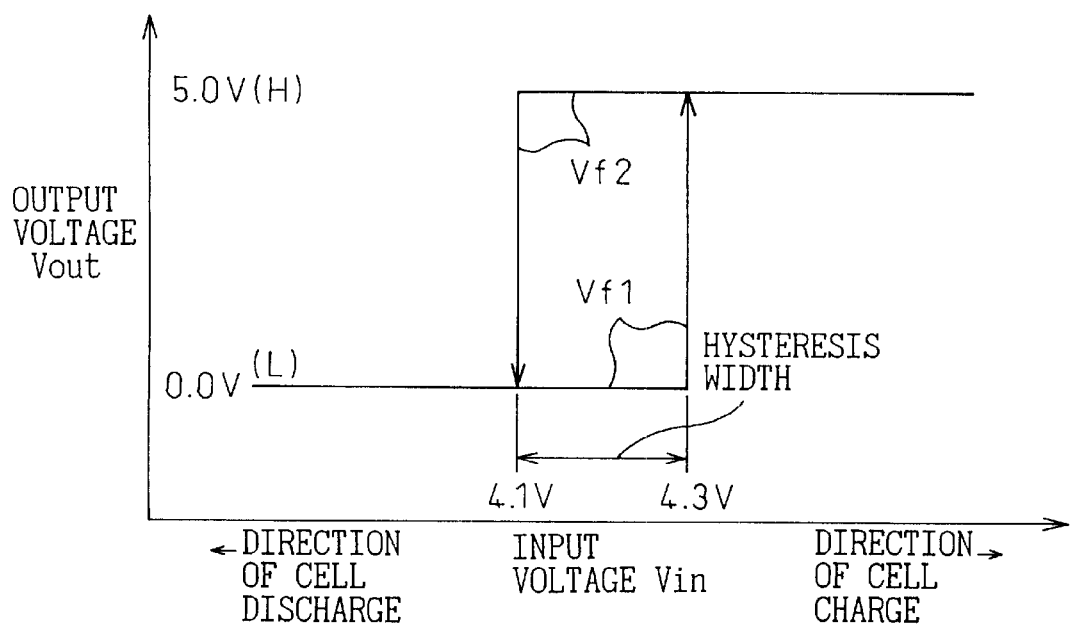
FIG. 19 is a characteristic diagram for explaining the hysteresis voltage providing a reference voltage according to the invention.

The hysteresis voltage adding circuit 61 fetches the result of comparison stored in the storage circuit D-FF, and at the next time of comparison with the voltage across the cells 1, 2, 3, 4, applies a voltage (about 5 V for "H" level, and about 0 V for "L" level) corresponding to the stored value to an end of the resistor R2 as a voltage for charging in FIG. 19, thereby providing a hysteresis.

With the circuit configuration of the over-charge detection and storage circuit 34 described above, the reference voltage Vf1 having a hysteresis at the time of charging as shown in FIG. 19 can be generated individually for the cells 1, 2, 3, 4.

In similar fashion, the over-discharge detection and storage circuit 36 is for detecting an over-discharge, and is configured with a comparator COMP, a storage circuit D-FF and a hysteresis voltage adding circuit 62.

The comparator COMP is for comparing the voltage of the capacitor C making up the cell voltage conversion circuit 33 with a reference voltage Vf2 ((Vf2 in FIG. 19) determined by other reference voltages, resistors R1, R2 and the output voltage (0 V or 5 V, for example) of the hysteresis voltage adding circuit 62 ), and outputs the result of comparison.

The storage circuit D-FF is configured with four units corresponding to cells 1, 2, 3, 4 for storing the result of comparison by the comparator COMP in the cells 1, 2, 3, 4 in synchronism. The output of the storage circuit D-FF is input to the hysteresis voltage adding circuit 62.

The hysteresis voltage adding circuit 62 fetches the result of comparison stored in the storage circuit D-FF, and at the next time of comparison with the voltage across the cell 1, 2, 3 or 4, applies a voltage (about 5 V for "H" level, and about 0 V for "L" level) corresponding to the stored value to an end of the resistor R2 as a voltage for charging in FIG. 19, thereby providing a hysteresis.

With the circuit configuration of the over-discharge detection and storage circuit 36 described above, the reference voltage Vf2 having a hysteresis at the time of discharge, as shown in FIG. 19, can be generated individually for the cells 1, 2, 3, 4.

The protection circuit 52 is for stopping the charge or discharge based on a no-charge signal from the over-charge detection and storage circuit 34 or a no-discharge signal from an over-discharge detection and storage circuit 36, by turning off the over-charge protection switch SW1 or turning off the over-discharge protective switch SW2, respectively, of FIG. 14.

The A/D converter 51 is for converting the analog voltage across the cell output from the cell voltage conversion circuit 33 into a digital signal and outputting it to the CPU. The timing generating circuit 39 is for supplying the timing signals T1, T2, T3, T4 in synchronism with the cells 1, 2, 3, 4 to the storage circuit D-FF and the hysteresis voltage adding circuits 61, 62 for synchronizing the same circuits.

Figure 16:
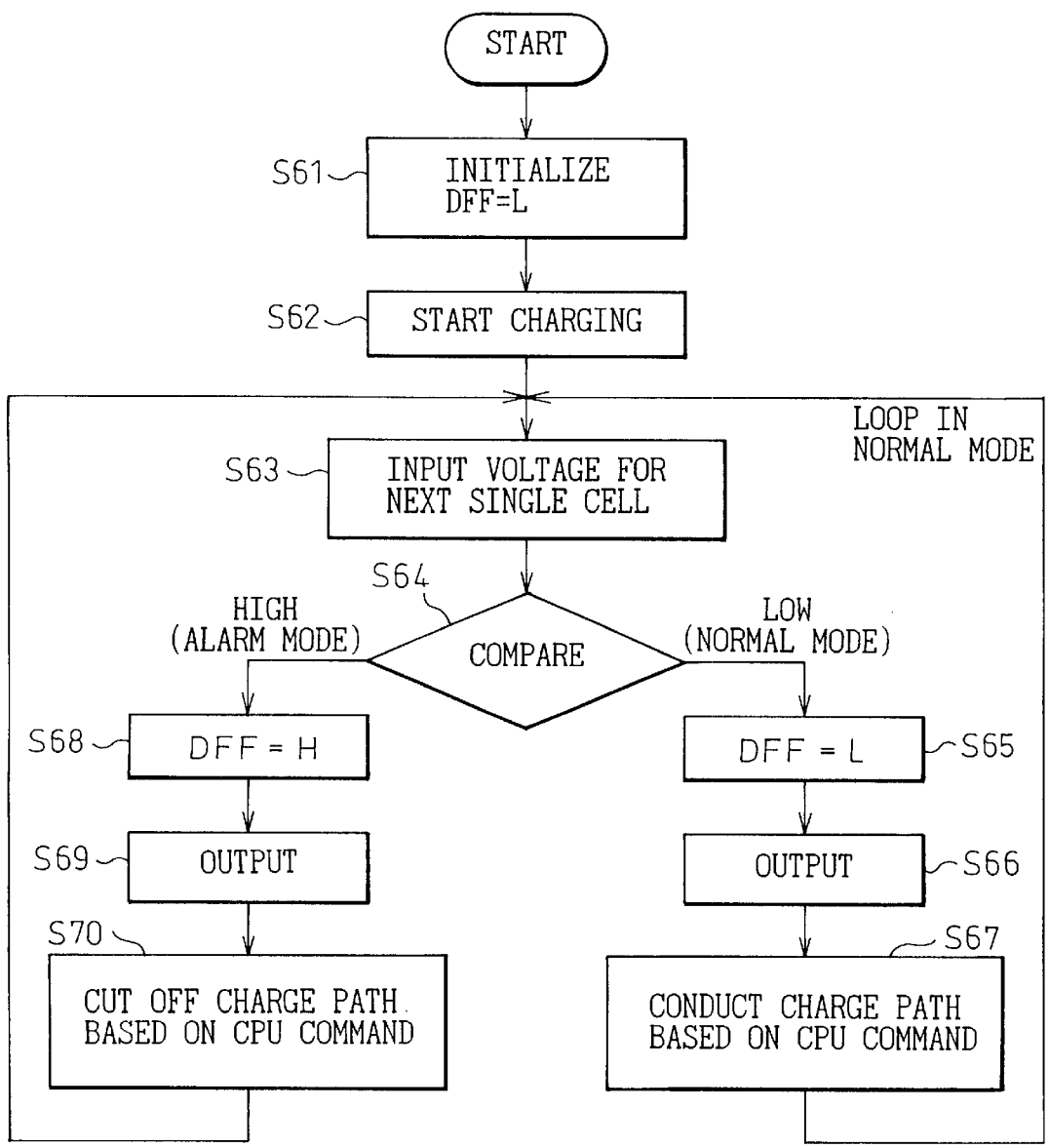
FIG. 16 is a flowchart showing the process of detecting an over-charge alarm state according to the invention.

Now, a detailed explanation will be given of the operation of the over-charge detection and storage circuit 34 shown in FIGS. 14 and 15 when detecting and storing the over-charge for each cell, with reference to the flowchart of FIG. 16. FIG. 16 is a flowchart for the process of detecting the over-charge alarm mode according to the invention. In FIG. 16, step S61 is for initializing (D-FF="L" level) the four storage circuits D-FF making up the over-charge detection and storage circuit 34 of FIG. 15.

In step S62, the current is supplied to the cell group from the charger 41 of FIG. 14 thereby to start charging. In step S63, the next cell voltage is input to the over-charge detection and storage circuit 34. In step S64, the comparator COMP making up the over-charge detection and storage circuit 34 of FIG. 15 compares the input voltage with the reference voltage Vf1. In the case where the input voltage is higher than the reference voltage Vf1 (in alarm mode), the process of steps S68 to S70 is executed. In the case where the input voltage is lower than the reference voltage Vf1 (in normal mode), on the other hand, the process of steps S65 to S67 is executed.

In step S65, in view of the fact that the result of comparison in step S64 is low and indicates that the normal mode is involved, the storage circuit D-FF of the particular cell making up the over-charge detection and storage circuit 34 of FIG. 15 is set to "L" level. In step S66, a signal indicating the fact that the result of comparison by the comparator COMP of the over-charge detection and storage circuit 34 of FIG. 15 is low (lower than the reference voltage Vf1) is output to the CPU, etc. In step S67, the charge path conducts based on the command of the CPU (the charge path conduction is doubled for the second and subsequent sessions before which the charge path already conducts). Then, the process is returned to step S63. In the normal mode loop of steps S63 to S67 described above, the operation of detecting the over-charge state is repeated for each cell thereby to monitor the over-charge condition.

In step S68, in view of the fact that a high state (alarm mode) is detected in step S64, the storage circuit D-FF of the particular cell making up the over-charge detection and storage circuit 34 of FIG. 15 is set to "H" level. In step S69, a signal indicating the fact that the result of comparison by the comparator COMP of the over-charge detection and storage circuit 34 of FIG. 15 is high (higher than the reference voltage Vf1) is output to the CPU, etc. In step S70, the charge path is cut off based on the command of the CPU. This is to prevent the over-charge by turning off (opening) the over-charge protection switch SW1 of FIG. 14. Then, the process is returned to step S63.

As the result of the process of steps S63, S64, S68, S69, S70 described above, the storage circuit D-FF is set to "H" state in alarm mode (over-charge detected) and the alarm mode is stored, while at the same time opening the charge circuit to prevent the over-charge.

Figure 17:
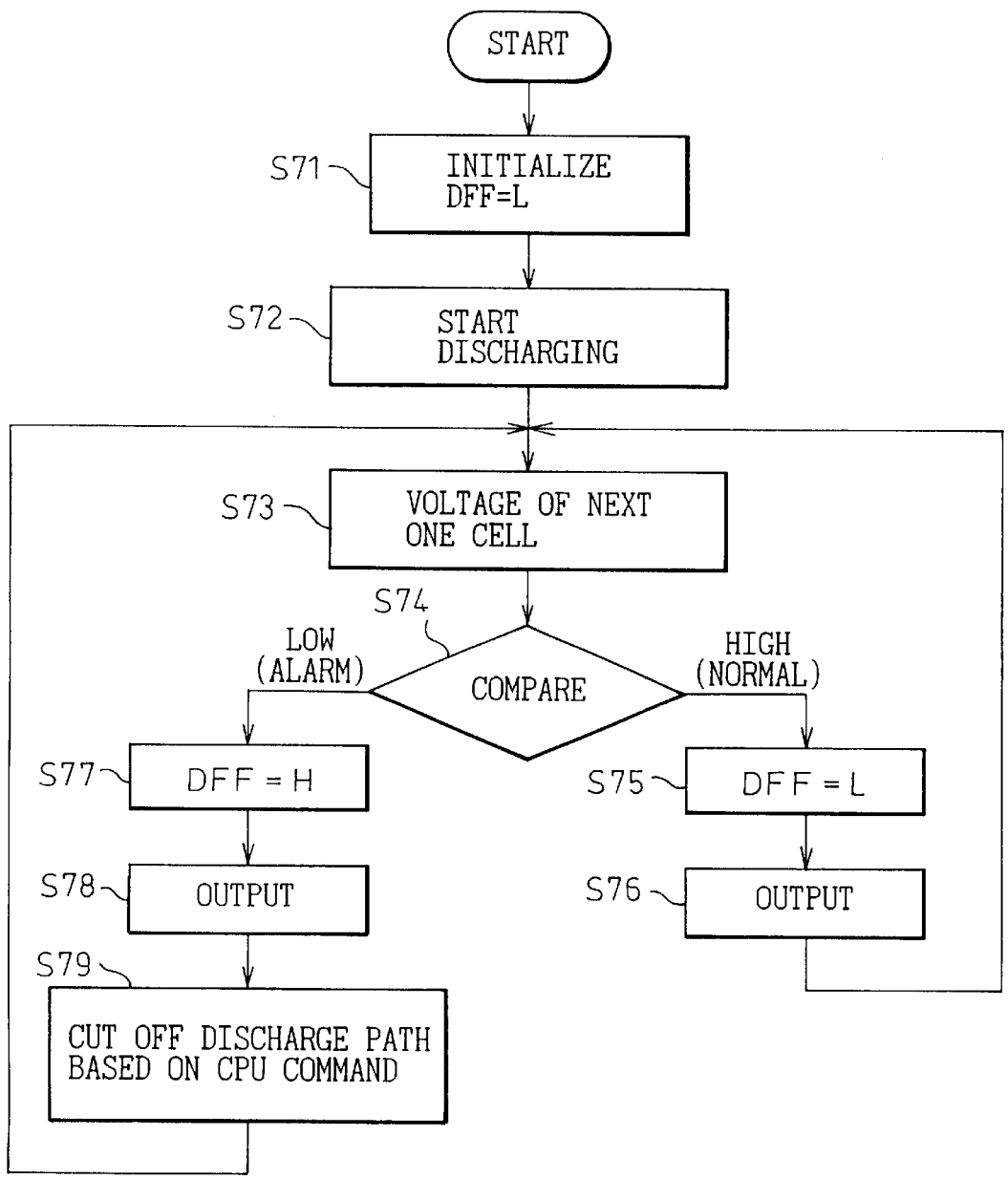
FIG. 17 is a flowchart for the process of detecting an over-discharge alarm state according to the invention.

FIG. 17 is a flowchart for explaining the process of detecting the over-charge alarm mode according to the invention. In step S71 of FIG. 17, the four storage circuits D-FF making up the over-discharge detection and storage circuit 36 of FIG. 15 are initialized (set to="L" level). In step S72, the discharge is started by supplying a current to the load 40 from the cell group in FIG. 14. In step S73, the voltage for the next single cell is input to the over-discharge detection and storage circuit 36.

In step S74, the comparator COMP making up the over-discharge detection and storage circuit 36 of FIG. 15 compares the input voltage with the reference voltage Vf2. In the case where the input voltage is lower than the reference voltage Vf2 (in alarm mode), the process of steps S77 to S79 is executed, while in the case where the input voltage is higher (in normal mode), the process of steps S75 and S76 is executed.

In view of the fact that the result of comparison in step S74 is low and the normal mode is involved, the storage circuit D-FF for the particular cell making up the over-discharge detection and storage circuit 36 of FIG. 15 is set to "L" level in step S75. In step S76, a signal indicating the fact that the result of comparison by the comparator COMP of the over-discharge detection and storage circuit 36 of FIG. 15 is higher (higher than the reference voltage Vf2) is output to the CPU, etc. By the normal mode loop of steps S73 to S76, the operation of detecting the over-discharge state is repeated for each cell, thereby making it possible to monitor the over-discharge.

In view of the fact that the low state (alarm mode) is detected in step S74, the storage circuit D-FF making up the over-discharge detection and storage circuit 36 of FIG. 15 is set to "H" level in step S77. In step S78, a signal indicating the fact that the result of comparison by the comparator COMP of the over-discharge detection and storage circuit 36 of FIG. 15 is low (lower than the reference voltage Vf2) is output to the CPU, etc. In step S79, the discharge path is cut off in response to a command from the CPU. This is to prevent the over-discharge by turning off (opening) the over-discharge protection switch SW2 of FIG. 14. Then, the process returns to step S73.

In steps S73, S74, S77, S78, S79 described above, the storage circuit D-FF is set to "H" in alarm mode (over-discharge detected state) thereby to store the alarm mode, while at the same time making it possible to prevent the over-discharge by disconnecting the load.

Figure 18:
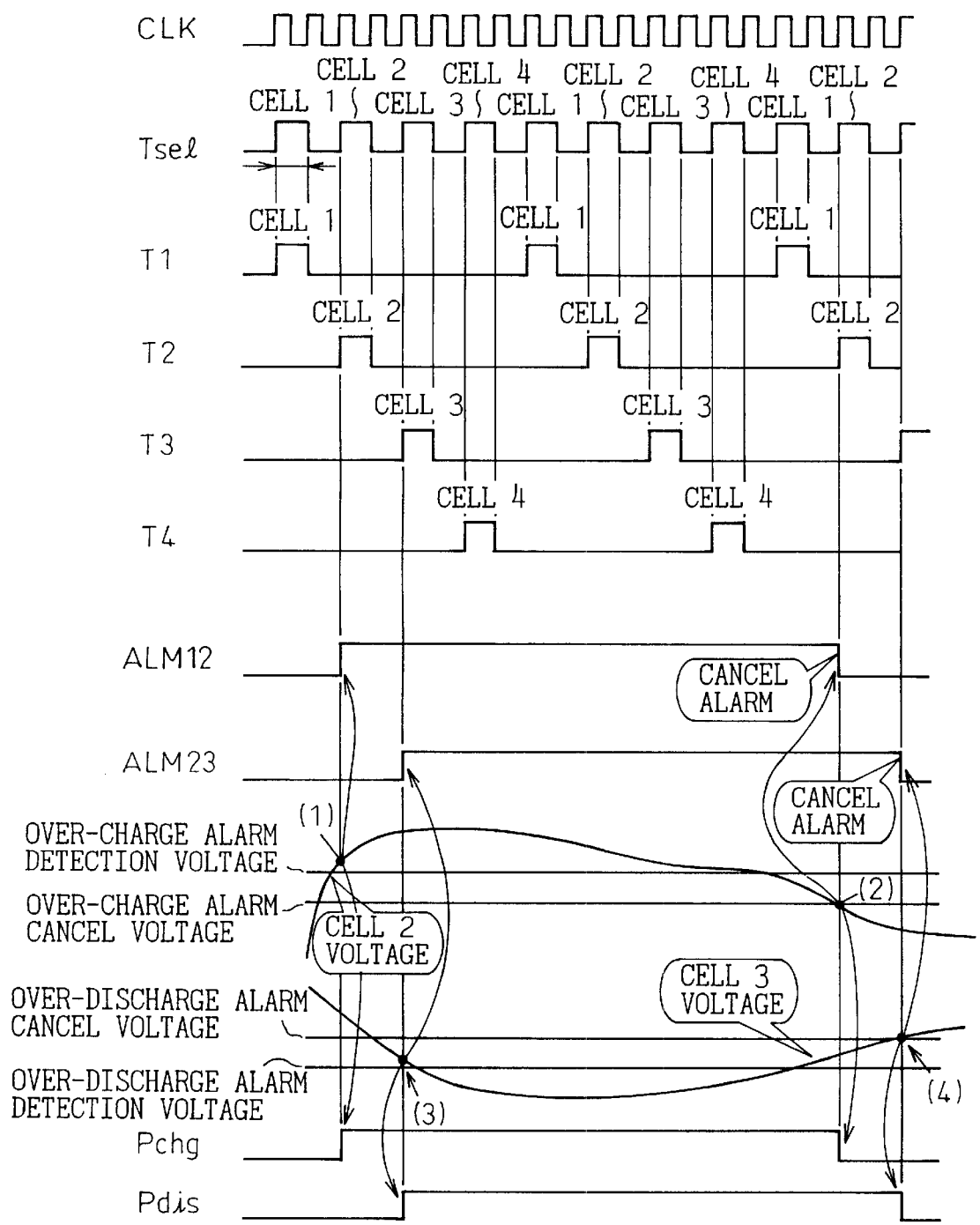
FIG. 18 is a time chart for explaining the operation of the invention.

FIG. 18 is a waveform diagram for the over-charge detection and the over-discharge detection described with reference to FIGS. 14 to 17. In FIG. 18, reference character CLK designates the clock supplied to the timing generating circuit 39 of FIG. 15. Character Tsel designates a signal for selecting the cell 1, cell 2, cell 3, cell 4 sequentially. Numerals T1, T2, T3, T4 are timing signals for selecting the cell 1, cell 2, cell 3, cell 4, respectively.

In FIG. 18, (1) shows the case in which the over-charge alarm mode of cell 2 is detected (step S64 in FIG. 6). In the case of (1), as indicated by arrows, the ALM12 signal is raised to "H" level (the storage circuit D-FF corresponding to the second cell 2 from above in the over-charge detection and storage circuit 34 of FIG. 15) while at the same time raising the no-charge signal Pchg to "H" level (the over-charge protection switch SW1 of FIG. 14 is opened so that the charging from the charger 4 to the cell group is stopped).

In FIG. 18, (2) represents the case in which the over-charge alarm mode is canceled. In this case, the voltage of the cell 2 is lower than the over-charge alarm cancellation voltage, and therefore the alarm ALM 12 and the no-charge signal Pchg are also canceled as shown.

In FIG. 18, (3) represents the case in which the over-charge alarm mode of the cell 3 is detected (step S74 in FIG. 17). In the case of (3), as indicated by arrow, the ALM23 signal is raised to "H" level (the storage circuit D-FF corresponding to the third cell 2 from above in the over-discharge detection and storage circuit 36 of FIG. 15 is reduced to "L") while at the same time raising the no-discharge signal Pdis to "H" level (the over-discharge protection switch SW2 of FIG. 14 is opened so that the discharging to the load 40 from the cell group is stopped).

In FIG. 18, (4) represents the case in which an over-discharge alarm is canceled. In this case, the voltage of the cell 3 is higher than the over-discharge alarm cancellation voltage, and therefore as shown, the signal ALM 23 and the no-discharge signal Pdis are canceled.

FIG. 19 is a diagram for explaining the hysteresis voltage as a reference voltage. In this case, the abscissa represents the input voltage Vin (input voltage to the comparator COMP in FIG. 15), and the ordinate represents the output voltage (say, H=5.0 V, L=0.0 V) of the comparator COMP. The arrows, on the other hand, indicate a model expression of hysteresis. At the time of charging, for example, the voltage Vf1 is input as a reference voltage Vf1 to the positive terminal of the comparator COMP making up the over-charge detection and storage circuit 34 of FIG. 15. At the time of discharge, on the other hand, the voltage Vf2 is applied as a reference voltage Vf2 to the positive terminal of the comparator COMP making up the over-discharge detection and storage circuit 36 of FIG. 15. Thus, the reference voltages Vf1, Vf2 having the hysteresis voltage (width) shown are generated and input for each cell.

FIG. 20 is a diagram for explaining a voltage monitor screen. As shown in FIG. 20, the following items obtained from the circuits or the processes of FIGS. 14 to 19 can be displayed in an easy-to-understand simplified fashion on a screen such as a small liquid crystal screen.

The state for each cell (discharging or charging, in discharge alarm or in charge alarm) and cell voltage, capacity level (%) for each cell Voltage and capacity level (%) of whole battery pack.

As described above, according to this invention, a configuration of a battery pack including a plurality of cells connected in series and parallel is employed, in which each cell is connected to a capacitor by a switch change-over circuit thereby to retrieve and measure the cell voltage and to detect the current. Therefore, the charge/discharge state can be detected for each cell, the charge/discharge can be controlled for each cell, and a fault, or the life, etc. can be displayed for each cell. As a result, (1) In a train of a plurality of cells connected in series, the voltage of a single cell is detected and monitored, and therefore the cell train (battery pack) can be protected with higher safety while at the same time making it possible to measure and display the whole battery capacity with high accuracy.

(2) Even in the case where an increased number of cell trains (battery packs) are connected each including cells connected in series, the cell voltage can be measured and monitored for each cell accurately, thereby making it possible to alleviate the limit of the number of the cells connected in series.

Figure 13A:
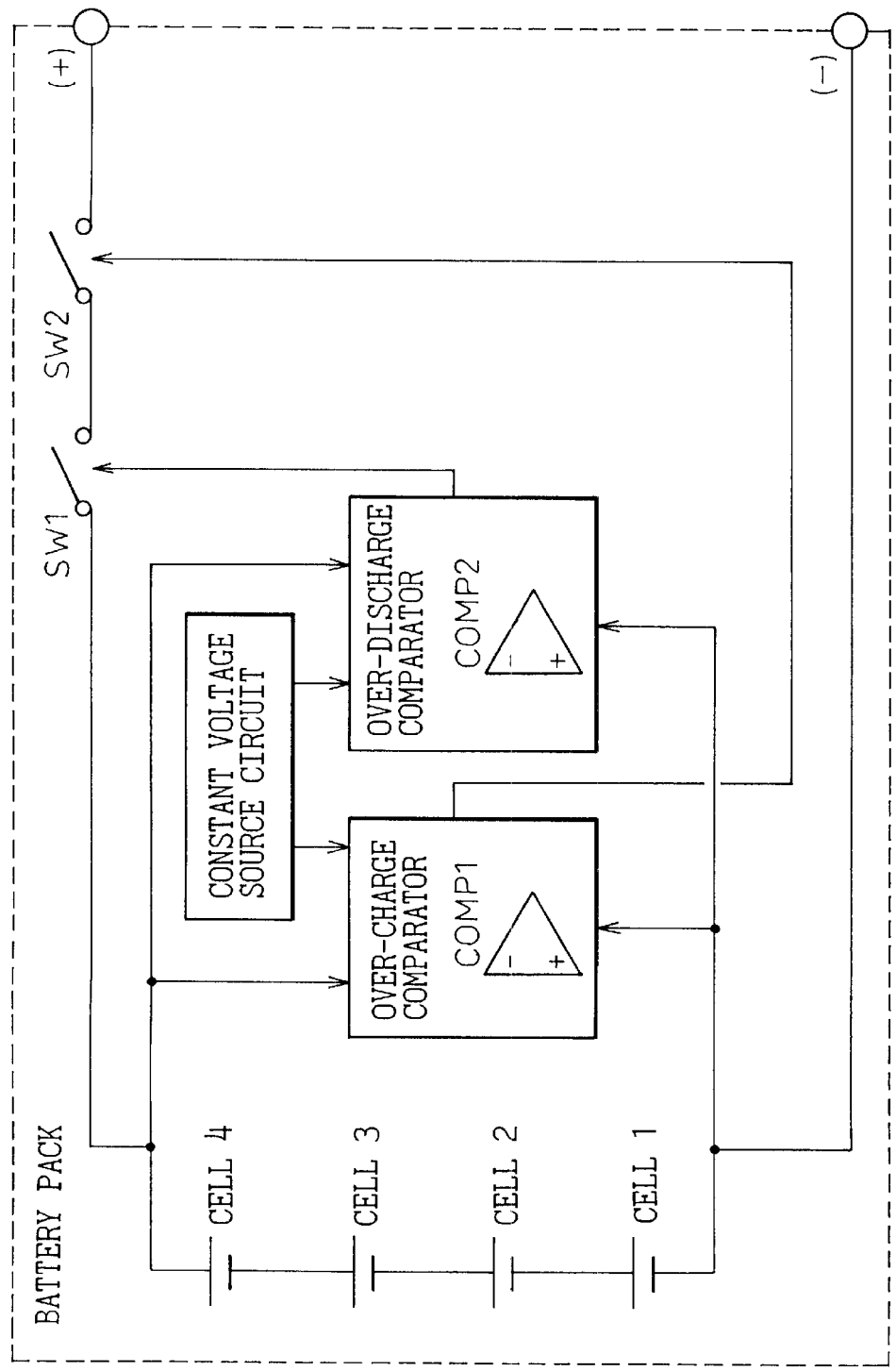
FIGS. 13A and 13B are diagrams for explaining the prior art.
Figure 13B:
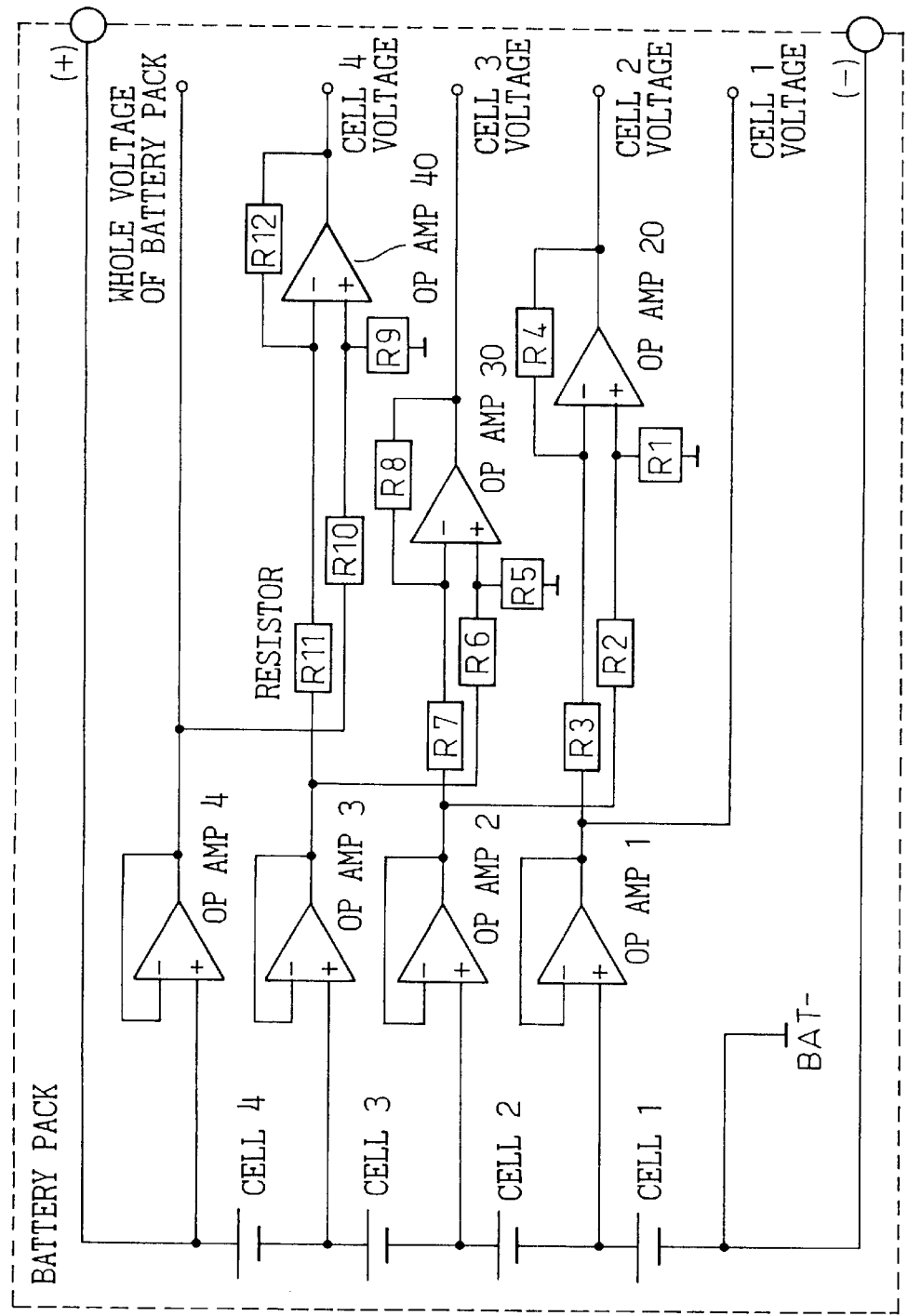

(3) The voltage of an arbitrary one of a plurality of the cells connected in series and parallel can be retrieved into a capacitor by switch change-over control, and the need of connecting an OP amplifier for each cell is eliminated unlike in the prior art shown in FIG. 13B. In addition, the OP amplifier need not be connected for each cell unlike in the prior art shown in FIG. 13B, and the voltage of each single cell can be detected with high accuracy free of the effect of the error due to the offset of the OP amplifier.

(4) Also, the voltage for each cell is detected by retrieving the voltage of an arbitrary cell into the capacitor by the switching change-over control as in (3) above, and therefore the circuit configuration can be simplified by reducing the number of OP amplifiers while at the same time making it possible to detect the voltage for each cell with high accuracy.

(5) The use of a small element such as an analog switch can reduce the circuit size and makes a low-cost production possible.

(6) Even in the case where a multiplicity of cells are connected in series to produce a high-voltage battery pack, the voltage of each cell can be detected highly accurately with a simple circuit configuration, and the charge/discharge of the battery pack, the voltage, fault, over-charge or over-discharge for each cell can be accurately measured thereby making possible highly safe monitoring.

(7) Since the end of discharge can be monitored for each cell, the over-discharge of the battery pack can be prevented with high accuracy.

(8) Since the end of charge can be monitored for each cell, the over-charge of the battery pack can be prevented with high accuracy.

(9) The voltage can be measured for each cell, and therefore it is possible to specify and display a given cell which is smaller in capacity than other cells, abnormal in internal resistance or otherwise deteriorated or faulty.

(10) The connection route can be determined for each cell, and therefore even in the case where the voltage is unbalanced between the cells, a cell requiring charging can be selectively charged thereby making it possible to attain the voltage balance among all the cells of the battery pack.

(11) The connection route can be determined for each cell, and therefore even in the case where the voltage is unbalanced between the cells, the cell requiring discharging can be selectively discharged thereby making it possible to attain the voltage balance among all the cells of the battery pack.

(12) In the case where the voltage measurement for the whole battery pack is required, the voltage is divided to 1/n, i.e. a voltage for about a single cell, by dividing resistors, and can be converted into a digital signal by an A/D converter. In this way, the input range of the analog voltage to the A/D converter can be narrowed for measuring the voltage value with low cost and high accuracy.

(13) A current-detecting resistor can be inserted in each cell train to measure the current.

(14) The voltage for each cell or a plurality of cells retrieved into the capacitor can be amplified through a single OP amplifier and input to an A/D converter for conversion into a digital voltage value. At the same time, the input of the particular OP amplifier is shorted to calibrate the offset value at any desired time. The voltage of each cell or a plurality of cells can thus be measured with high accuracy.

(15) The remaining capacity and the life of the battery pack can be determined with high accuracy based on the voltage and current measured for each cell or a plurality of cells.

(16) The remaining capacity and the life of each cell can be determined with high accuracy based on the voltage and current measured for each cell.

(17) The state of each cell (over-charged, over-discharged, normal) of the battery pack having a plurality of cells connected in series and parallel can be individually detected.

(18) The state of each cell (over-charged, over-discharged, normal) of the battery pack having a plurality of cells connected in series and parallel can be individually detected and collectively displayed on a voltage monitor screen in an easy-to-understand manner.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A battery monitor apparatus for monitoring at least the voltage of each cell of a battery pack including a plurality of cells, comprising:
   a capacitor;
   a group of switches for connecting the ends of one arbitrary cell or the ends of a plural cells fewer in number than all the cells constituting said battery pack to said capacitor and retrieving the voltage of said one cell or said plural cells; and
   a detector for detecting the voltage of said capacitor.

2. A battery monitor apparatus according to claim 1, wherein the voltage retrieved from the ends of said capacitor is divided by resistors to a voltage equivalent to a single stage of all the stages of the cells from which the voltage is retrieved, and the analog voltage after said division is converted into a digital voltage.

3. A battery monitor apparatus according to claim 1, wherein a part of an arbitrary number of plural stages of cells with the voltage thereof divided into a voltage equivalent to the voltage of one of the stages of said arbitrary cells is connected to said capacitor by said switch group thereby to retrieve the voltage of said plural cells substantially as the voltage of a single cell.

4. A battery monitor apparatus according to claim 1, wherein the ends of one or plural cells making up said battery pack are connected to said capacitor sequentially for all the cells by said switch group, said detector thus detects the voltage of said one or said plural cells sequentially, and the voltage of said battery pack is calculated based on the voltage thus detected.

5. A battery monitor apparatus according to claim 1, wherein said detector is a voltage follower circuit, and the current is prevented from leaking as far as possible at the time of detection of the voltage across said capacitor.

6. A battery monitor apparatus according to claim 1, wherein the ends of the cell detected by said detector to be lower in voltage than a specified value are connected to the ends of a charge power supply by said switch group, thereby charging said charge power supply.

7. A battery monitor apparatus according to claim 1, wherein the ends of the cell detected by said detector to be higher in voltage than a specified value are connected to the ends of a charge power supply by said switch group, thereby discharging said charge power supply.

8. A battery monitor apparatus according to claim 1, wherein said capacitor has a minimum capacity at which said detector can detect a voltage.

9. A battery monitor apparatus for monitoring at least the voltage of each cell of a battery pack including a plurality of cells, comprising:
   a capacitor;
   a group of switches for connecting the ends of an arbitrary single cell or the ends of a plural cells fewer in number than all the cells constituting said battery pack to said capacitor and retrieving the voltage of said single cell or said plural cells;
   a comparator circuit for comparing the voltage of said capacitor with a predetermined reference voltage and detecting the normal state, the over-charge state or the over-discharge state; and
   a circuit for storing said normal state, said over-charge state or said over-discharge state.

10. A battery monitor apparatus according to claim 9, further comprising a circuit for storing an over-charge state or an over-discharge state in synchronism with the detection of said over-charge state or said over-discharge state, as the case may be, for each single cell or plural cells individually and subsequently adding a hysteresis voltage individually to said predetermined reference voltage.

11. A battery monitor apparatus according to claim 1, further comprising control means for outputting a signal indicating the end of discharge for each cell based on the voltage of each cell detected by said detector or said voltage and the current flowing in said cell.

12. A battery monitor apparatus according to claim 1, further comprising control means for outputting a signal indicating the end of charge for each cell based on the voltage of each cell detected by said detector or said voltage and the current flowing in said cell.

13. A battery monitor apparatus according to claim 1, further comprising control means for outputting a signal indicating the deterioration or fault of each cell based on the voltage of said cell detected by said detector or said voltage and the current flowing in said cell.

14. A battery monitor apparatus according to claim 1 or 9, further comprising a current measuring circuit for measuring the current flowing through a resistor in each cell train including a plurality of cells connected in series, a plurality of said cell trains being connected in parallel.

15. A battery monitor apparatus according to claim 1, wherein the input terminal of said detector is connected to a predetermined voltage as required for detecting and storing an offset value of said detector thereby to correct the offset of the voltage detected by said detector.

16. A battery monitor apparatus according to claim 1, wherein the remaining capacity and/or the remaining life of each cell is determined and/or displayed for each cell based on the voltage of each cell detected by said detector and said voltage and the current flowing in said cell.

17. A battery monitor apparatus according to claim 1 or 9, wherein said switch group is a group of analog switches.

18. A battery monitor apparatus according to claim 9, further comprising a voltage monitor for displaying the normal charge/discharge, over-charge or over-discharge state and the voltage detected for each cell or plurality of said cells.

19. A battery monitor apparatus according to claim 9, further comprising a protection circuit for stopping the charge or discharge upon detection of an over-charge or an over-discharge, as the case may be, for each cell or for plurality of said cells.

* * * * *